(12) United States Patent
Okubora

(10) Patent No.: US 7,470,977 B2
(45) Date of Patent: Dec. 30, 2008

(54) MODULAR BOARD DEVICE, HIGH FREQUENCY MODULE, AND METHOD OF MANUFACTURING SAME

(75) Inventor: Akihiko Okubora, Kanagawa (JP)

(73) Assignee: Sony Corporation, Tokyo (JP)

( * ) Notice: Subject to any disclaimer, the term of this patent is extended or adjusted under 35 U.S.C. 154(b) by 453 days.

(21) Appl. No.: 10/519,765

(22) PCT Filed: Jun. 19, 2003

(86) PCT No.: PCT/JP03/07827

§ 371 (c)(1),
(2), (4) Date: Dec. 28, 2004

(87) PCT Pub. No.: WO2004/006332

PCT Pub. Date: Jan. 15, 2004

(65) Prior Publication Data

US 2005/0288392 A1 Dec. 29, 2005

(30) Foreign Application Priority Data

Jul. 3, 2002 (JP) ............................. 2002-195022

(51) Int. Cl.
*H01L 23/552* (2006.01)
*H01L 23/34* (2006.01)
(52) U.S. Cl. ...................... 257/660; 257/659; 257/728; 257/724; 257/E23.114
(58) Field of Classification Search ................. 257/728, 257/660, 724, 659, 778, 701, E23.114
See application file for complete search history.

(56) References Cited

U.S. PATENT DOCUMENTS 5,780,776 A * 7/1998 Noda .......................... 174/255
5,796,165 A * 8/1998 Yoshikawa et al. ........... 257/728
6,686,649 B1 * 2/2004 Mathews et al. ............. 257/659
7,045,440 B2 * 5/2006 Huff et al. .................... 438/456
7,061,100 B2 * 6/2006 Iwaki et al. .................. 257/706
2001/0027605 A1 10/2001 Yoshie
2002/0033378 A1 3/2002 Teruhisa
2002/0056920 A1 * 5/2002 Fujinaga ...................... 257/774

FOREIGN PATENT DOCUMENTS

EP 1061577 12/2000
EP 1069616 1/2001

(Continued)

Primary Examiner—Nitin Parekh
(74) Attorney, Agent, or Firm—Robert J. Depke; Rockey, Depke & Lyons, LLC.

(57) ABSTRACT

The present invention is directed to a high frequency module used for wireless communication module, and comprises a first organic substrate (11) in which conductive pattern or patterns are formed on the principal surface thereof and one element body (7) or more are mounted, and a second organic substrate (12) in which a recessed portion (22) is formed in correspondence with the area where the element body or bodies (7) are mounted at the connecting surface to the first organic substrate (11). In the state where the second organic substrate (12) is connected to the first organic substrate (11), an element body accommodating portion (24) which seals the element body or bodies (7) is constituted by the recessed portion (22), wherein the element body accommodating portion (24) is adapted so that moisture resistance characteristic and oxidation resistance characteristic are maintained.

10 Claims, 11 Drawing Sheets

FOREIGN PATENT DOCUMENTS

| | | |
|---|---|---|
| GB | 2 171 850 | 9/1986 |
| JP | 59847 | 8/1993 |
| JP | 9-321439 | 12/1997 |
| JP | 2000-223837 | 8/2000 |
| JP | 2000-357771 | 12/2000 |
| JP | 2001-291817 | 10/2001 |
| JP | 2002-164467 | 6/2002 |
| JP | 2003-100937 | 4/2003 |
| WO | WO 00/25558 | 5/2000 |

* cited by examiner

MODULAR BOARD DEVICE, HIGH FREQUENCY MODULE, AND METHOD OF MANUFACTURING SAME

This application claims priority to Japanese Patent application Ser. No. JP2002-195022, filed Jul. 3, 2002, which is incorporated herein by reference.

TECHNICAL FIELD

The present invention relates to a module board device and a high frequency module suitable when used in wireless communication modules which are provided at various electronic equipments having wireless communication function such as personal computers, audio equipments, various mobile equipments and/or mobile telephones and permit compatibility at different frequency bands, and a method of manufacturing these module units.

This Application claims priority of the Japanese Patent Application No. 2002-195022, filed on Jul. 3, 2002, the entirety of which is incorporated by reference herein.

BACKGROUND ART

Various information, e.g., music, speech and/or image, etc. have been permitted to be easily handled also by personal computer or mobile computer, etc. with digitization of data in recent years. Moreover, band-compression of these information has been realized by audio (speech) codec technology or image codec technology so that the environment where these information are easily and efficiently distributed (delivered) to various communication terminal equipments by digital communication or digital broadcast is being arranged. For example, audio/video data (AV data), etc. can be received at the indoor/outdoor by wireless system through mobile telephone, etc. without limitation only to reception by wire system Meanwhile. with respect to the transmission/reception system for data, etc., suitable network systems have been constructed also within home and/or small area, and have been variously utilized. As the network system, attention is drawn to the various next generation wireless systems, e.g., narrow-band wireless communication system of 5 GHz band proposed in the IEEE802.11a, wireless LAN system of 2.45 GHz band proposed in the IEEE802.11b, and/or near distance wireless communication system called Bluetooth, etc. In the transmission/reception system for data, etc. such various wireless network systems are effectively utilized so that transmission/reception of various data, access to the Internet and/or transmission/reception of data can be made easily and without intervention of relay board, etc. at various places such as home or outdoors, etc.

In the wireless network systems, respective communication terminal equipments are permitted to be connected with respect to all communication systems so that effective utilization can be realized. Such wireless network systems not only lead to enlargement and/or high cost of communication terminal equipments, but also result in large burden also with respect to the communication infrastructure side. Communication terminal equipments are utilized not only at indoor but also at outdoor, etc., and are indispensable that they are compact and light in weight and are portable, and are inexpensive. For this reason, it is extremely difficult to constitute the communication terminal equipments so that they are adapted to the specification of such wireless network system.

In the communication terminal equipments, there is being made development of the so-called Software Defined Radio technology in which compliance is made by base-band processing below modulation/demodulation processing with respect to respective communication systems and/or frequency bands to thereby constitute wireless communication units as integral unit. However, even such SDR technology has vast calculation quantity for signal processing. As a result, even if compliance of burden at the communication infrastructure side can be realized, compliance of power consumption at the communication terminal equipment side and/or compliance of enlargement by integration are great problems. Particularly, it is difficult that portable communication terminal equipments are put to practical use.

A wireless communication module 100 shown in FIGS. 1 and 2 constitutes an analog front end of a wireless transmitter/receiver, wherein there is realized the so-called multi-band configuration in which base band portion is shared with respect to the same modulation/demodulation system or different modulation/demodulation system, and plural transmitting/receiving units are included (provided) to permit transmission/reception of wireless signals of different frequency bands. The wireless communication module 100 transmits or receives wireless signals of different frequency bands at an antenna unit 101.

The wireless communication module 100 comprises, as shown in FIG. 1, although the detail is omitted, a receive signal processing system 107 adapted for converting a high frequency signal received at the antenna unit 101 into an intermediate frequency signal on the basis of reference frequency delivered from a reference frequency generating circuit unit 103 at a RF-IF converting unit 102 to amplify the intermediate frequency signal thus obtained at an amplifier unit 104 thereafter to demodulate the intermediate frequency signal thus amplified at a demodulation unit 105 to output the signal thus obtained to base-band units 106. The wireless communication module 100 comprises, although the detail is omitted, a transmit signal processing system 110 for directly converting the intermediate frequency signal outputted from the base-band unit 106 into high frequency signal at an IF-RF converting unit 108 and demodulating that intermediate frequency signal to transmit the signal thus obtained from the antenna unit 101 through an amplifier unit 109.

Although the detail is omitted, the wireless communication module 100 is adapted so that large functional components (parts) such as various filters, Voltage Controlled Oscillator (VCO) and Surface Acoustic Wave (SAW) device, etc. are mounted between respective stages, and includes passive elements such as inductors, capacitors and/or resistors, etc. which are specific to high frequency analog circuit. At the wireless communication module 100, as shown in FIG. 1, first to third changeover switches 111 to 113 are provided at RF-IF converting unit 102, reference frequency generating circuit unit 103 or demodulation unit 105 of the receive signal processing system 107. Moreover, at the wireless communication module 100, fourth and five changeover switches 114 and 115 are provided also at IF-RF converting unit 108 or amplifier unit 109 within the transmit signal processing system 110.

Although the detail is omitted, the first to third changeover switches 111 to 113 are caused to undergo switching operation to perform capacity switching of variable capacitors and/or variable reactances to thereby perform control of time constant switching so as to match the frequency characteristic of receive signal. Although the detail is omitted, the fourth and five changeover switches 114 and 115 are also caused to undergo switching operation to thereby perform capacity switching of variable capacitors and/or variable reactances to perform control of time constant switching so as to match frequency characteristic of transmit signal.

The wireless communication module 100 comprises, as shown in FIG. 2, a module board (substrate) 120 comprised of multi-layered wiring board, and is constituted, although the detail is omitted, as the result of the fact that passive elements and/or capacity patterns, etc. constituting the above-described respective functional blocks are formed together with wiring patterns within respective wiring layers of the module board 120. At the module board 120, a high frequency signal processing LSI 121 and suitable chip components (parts) 122 are mounted on the surface thereof, and a shield cover 123 is assembled for the purpose of excluding the influence of electromagnetic noise. It is to be noted that, at the module board 120, antenna pattern constituting the antenna unit 101 may be formed at, e.g., a portion which is not covered by the shield cover 123 of the surface. In addition, at the module board 120, antenna unit 101 may be constituted by chip-type antenna mounted on the surface, or transmit/receive signal may be inputted or outputted from the antenna of separate member.

At the wireless communication module 100, as shown in FIG. 2, the above-described first to five changeover switches 111 to 115 are constituted by MEMS (Micro Electro Mechanical System) switches 130 mounted on the surface of the module board 120. As shown in FIG. 3, the entirety of the MEMS switch 130 is covered by an insulating cover 131. The MEMS switch 130 is mounted on module wiring board 120 as described above through leads 132 drawn from the insulating cover 131.

As shown in FIG. 3, the MEMS switch 130 is adapted so that a first fixed contact 134, a second fixed contact 135 and a third fixed contact 136 are formed on a silicon substrate 133, and a movable contact piece 137 in a thin plate form and having flexibility is fixed at the first fixed contact 134 and the free end thereof is cantilever-supported in a manner opposed to the third fixed contact 136. The MEMS switches 130 are respectively connected to leads 132 through wires 138 in the state where the first and third fixed contacts 134 and 136 are used as output contact. Additionally, the second fixed contact 136 is also connected to other lead 132. At the movable contact piece 137, an electrode 139 is provided at the portion opposite to the second fixed contact 135.

At the MEMS switch 130, as shown in FIG. 3, a silicon cover 140 is connected onto the silicon base 133 by, e.g., anode connecting method, etc. to allow the first to third fixed contacts 134 to 136 and the movable contact piece 137 to be maintained in the air-tight state. The entirety of the MEMS switch 130 is sealed by the insulating cover 131 so that the MEMS switch 130 is integrated as package. At the MEMS switch 130, as the result of the fact that the movable portion thereof is sealed by the silicon substrate 133 and the silicon cover 140 and the entirety thereof is sealed by the insulating cover 131, moisture resistance characteristic and oxidation resistance characteristic are maintained, and durability with respect to the mechanical load from the external is maintained.

At the MEMS switch 130 constituted as described above, when drive voltage is applied, the third fixed contact 136 and the movable contact piece 137 are shorted by electromagnetic attractive force produced between the second fixed contact 135 and the electrode 139 of the movable contact piece 137, and the short state thereof is maintained. At the MEMS switch 130, when reverse bias drive voltage is applied, the movable contact piece 137 is returned to the initial state by electromagnetic repulsive force produced between the second fixed contact 135 and the electrode 139 so that the short state with respect to the third fixed contact 136 is released. Since the MEMS switch 130 is a switch element which is extremely very small and does not require holding current for holding the operating state, it is possible to suppress enlargement of the wireless communication module 100 and to realize low power consumption.

The wireless communication module 100 as described above is caused to be of the configuration in which switching of time constant is performed by the MEMS switches 130 to thereby switch the frequency characteristics of the antenna, respective filters and/or VCO, etc. so that there results tunable state. Meanwhile, since the MEMS switch 130 has movable portion, first to third fixed contacts 134 to 136 and/or wiring patterns are finely formed on the silicon substrate 133 as described above, and the silicon base 133 and the silicon cover 140 are connected by the anode connecting method, etc. thereafter to cover it by the insulating cover 131 so that the MEMS switch 130 is caused to be of package configuration. Thus, MEMS switches 130 are mounted on the module board similarly to other mounting components (parts).

In the above-described conventional wireless communication module 100, there is the problem that the characteristic is lowered by the influence on the high frequency circuit unit resulting from reflection or loss from parasitic component of the MEMS switch 130. In the wireless communication module 100, there is the problem that MEMS switches are mounted on the surface of the module board 120 so that path lengths between the MEMS switches 130 and internal circuits are elongated, whereby the characteristic is lowered by the influence of the interference or loss. Further, in the wireless communication module 100, since the MEMS switch 130 has the structure that respective components are assembled on the silicon substrate 133 and are sealed by the insulating cover 131 so that they are packaged, further miniaturization is difficult.

In the above-described conventional wireless communication module 100, e.g., SAW device (Surface Acoustic Wave Device), and/or IC and LSI for micro-wave or mili-wave, etc. are also mounted. There is the problem that in the case where these elements are coated by insulating resin, their characteristics are remarkably deteriorated.

DISCLOSURE OF THE INVENTION

An object of the present invention is to provide a novel module board device and a method of manufacturing the same, which can solve problems that conventional wireless communication modules have.

Another object of the present invention is to provide a module board device and a method of manufacturing the same, which does not require package structure of elements to realize improvement in reliability along with miniaturization and low cost.

A further object of the present invention is to provide a high frequency module having multi-band compliance function, which comprises MEMS switches which permit compatibility at different frequency bands and/or elements of which characteristics are deteriorated by resin sealing, and which realizes improvement in the characteristics and reliability of these elements and realizes miniaturization and low cost, and a method of manufacturing such a high frequency module.

A board device for module according to the present invention comprises a first organic substrate in which a conductive pattern or patterns is or are formed on the principal surface thereof and one element body is or more are mounted, and a second organic substrate in which a recessed portion is formed in correspondence with the area where the element body or bodies is or are formed at a connecting surface to the first organic base. At the module board device, an element accommodating space portion which seals the element body or bodies is constituted by the recessed portion in the state where the second organic base is connected to the first organic base. At the module board device, the element body accommodating space portion is constituted as a space portion in which moisture resistance characteristic and oxidation resistance characteristic are maintained.

At the module board device, since element body or bodies are constituted at the inside of wiring layer, and element body or bodies are directly formed at the element body accommodating space portion in which moisture resistance characteristic and oxidation resistance characteristic are maintained, package for maintaining moisture resistance characteristic and/or oxidation resistance characteristic, and/or for preventing the element body or bodies from mechanical load from the external is not required at the element body. As a result, miniaturization thereof can be realized and path lengths with respect to the wiring layer are shortened. Thus, low loss and improvement in noise resistance characteristic can be realized. At the module board device, aging deterioration (deterioration with lapse of time) of the element body is maintained in a manner equivalent to the packaged state so that stable operation is performed, and occurrence of inconvenience such as damage, etc. of package by evaporation of moisture immersed into the inside in reflow soldering, etc. is also prevented. At the module board device, MEMS switch which can change capacitance characteristic of antenna or filter with respect to different frequency bands is used as the element body, thereby making it possible to obtain compact and thin type, and high reliability high frequency module which has realized multi-band compliance function.

A method of manufacturing a board device for module according to the present invention includes a step of mounting one element body or more on the principal surface of a first organic substrate in which a conductive pattern or patterns is or are formed, and a step of connecting a second organic substrate, in which a recessed portion is formed in correspondence with the area where the element body or bodies is or are formed at a connecting surface to the first organic substrate, to the first organic substrate in such a manner to seal the element body or bodies within an element accommodating space portion constituted by the recessed portion, thus to manufacture a module board device including the element body accommodating space portion in which moisture resistance characteristic or oxidation resistance characteristic are maintained.

In the manufacturing method for board device for module according to the present invention, since element body or bodies are constituted at the inside of the wiring layer, and element body or bodies are directly formed at element body accommodating space portion constituted in which moisture resistance characteristic and oxidation resistance characteristic are maintained, package for maintaining moisture resistance characteristic or oxidation resistance characteristic, and/or for protecting the element body from mechanical load from the outside is not required at the element body. As a result, miniaturization thereof is realized and path lengths with respect to the wiring layers are shortened. Thus, module board device in which low loss and improvement in noise resistance characteristic have been realized is manufactured. In accordance with the manufacturing method for board device for module, it becomes possible to efficiently manufacture, in the state where occurrence of inconvenience such as damage, etc. of package by evaporation of moisture immersed into the inside in reflow soldering, etc. is prevented, module board device in which aging deterioration of element body is maintained in a manner equivalent to the packaged state so that stable operation is performed.

The high frequency module according to the present invention is composed of a base substrate portion, and a high frequency circuit portion which is built up on the principal surface of the base substrate portion. The base substrate portion comprises a first organic substrate in which a conductive pattern or patterns is or are formed on the principal surface thereof and an element body or bodies is or are mounted, and a second organic substrate in which a recessed portion is formed in correspondence with the area where the element body or bodies is or are formed at a connecting surface to the first organic substrate, whereby, in the state where the first organic substrate and the second organic substrate are connected, an element body accommodating space portion which seals the element body or bodies is constituted by the recessed portion, and the element body accommodating space portion is caused to have moisture resistance characteristic and oxidation resistance characteristic and a second principal surface opposite to the connecting surface of either one of the first organic substrate and the second organic substrate is caused to undergo planarization (flattening) processing to constitute build-up formation surface. The high frequency circuit portion comprises one build-up wiring layer or more in which a conductive pattern or patterns is or are formed on a dielectric insulating layer at the build-up formation surface of the base substrate portion, and including at least one kind of passive element or more formed by the thin film technology or the thick film technology, the build-up wiring layer being via-connected to the base substrate portion and/or the element body or bodies, and high frequency circuit components (parts) mounted on the build-up wiring layer of the uppermost layer.

At the high frequency module according to the present invention, since, e.g., MEMS switch or switches which can change capacity characteristic of antenna or filter to realize multi-band function, and/or element body or bodies of which characteristics are deteriorated by resin coating, etc. are constituted within the wiring layer of the base substrate portion, and are directly formed at element body accommodating space portion in which moisture resistance characteristic and/or oxidation resistance characteristic are maintained, package for maintaining moisture resistance characteristic and/or oxidation resistance characteristic and for protecting the element body from mechanical load from the external becomes is not required at the element body. As a result, miniaturization thereof can be realized and path lengths with respect to the wiring layers are shortened. Thus, low loss and improvement in noise resistance characteristic can be realized. At the high frequency module, aging deterioration of the element body is maintained in a manner equivalent to the packaged state so that suitable operation is performed, and occurrence of inconvenience such as damage, etc. of package by evaporation of moisture immersed into the inside in reflow soldering, etc. is also prevented. Further, at the high frequency module, high frequency circuit portion in which various passive elements are formed on planarized (flattened) build-up formation surface of the base substrate portion including relative inexpensive organic substrate is formed with high accuracy so that reduction of cost can be realized, and the base substrate portion is constituted as, e.g., wiring portions for power supply and/or ground portion, and/or wiring portion for the control system. Thus, electrical isolation from the high frequency circuit portion can be realized. In accordance with the high frequency module, occurrence of electric interference of the high frequency circuit portion is suppressed so that improvement in the characteristic is realized. Since wirings for power supply and/or ground portion having sufficient area can be formed on the base substrate portion, power supply of high regulation is performed.

The method of manufacturing a high frequency module according to the present invention includes a formation step for high frequency circuit portion for build-up forming the high frequency circuit portion on a planarized (flattened) build-up formation surface via a step of manufacturing a base substrate portion. In the manufacturing method for high frequency module, the step of manufacturing the base substrate includes a step of mounting an element body or bodies on the principal surface of a first organic substrate in which a conductive pattern or patterns is or are formed, a step of connecting a second organic substrate, in which a recessed portion is formed in correspondence with the area where the element body or bodies is or are formed at a connecting surface to the first organic substrate, to the first organic substrate in such a manner to seal the element body or bodies into the element body accommodating space portion constituted by the recessed portion and for constituting the element body accommodating space portion as a space portion in which moisture resistance characteristic and/or oxidation resistance characteristic are maintained, and a step of implementing planarization (flattening) processing to a second principal surface opposite to the connecting surface of either one of the first organic substrate and the second organic substrate to form a build-up formation surface, thus to form a base substrate portion where inactive gas is sealed within the element body accommodating space portion. In the manufacturing method for high frequency module, the step of forming the high frequency circuit portion includes a step of forming one build-up wiring layer or more in which a conductive pattern or patterns is or are formed on a dielectric insulating layer, and at least one kind of passive element or more is or are formed by the thin film technology or the thick film technology, the build-up wiring layer being via-connected to the conductive pattern or patterns and/or the element body or bodies of the first organic substrate of the base substrate portion, and a step of mounting high frequency circuit components (parts) on the build-up wiring layer of the uppermost layer, thus to form high frequency circuit portion on the build-up formation surface of the base substrate portion.

In the manufacturing method for high frequency module according to the present invention, since element body or bodies are constituted within the wiring layer of the base substrate portion, and are directly formed within the element body accommodating space portion in which moisture resistance characteristic and/or oxidation resistance characteristic are maintained, package for maintaining moisture resistance characteristic and/or oxidation resistance characteristic, and/or for protecting the element body or bodies from mechanical load from the external is not required at the element body. As a result, miniaturization thereof can be realized and path lengths with respect to the wiring layers are shortened. Thus, high frequency module in which low loss and improvement in noise resistance characteristic have been realized is manufactured. In the manufacturing method for high frequency module, aging deterioration of the element body is maintained in a manner equivalent to the packaged state so that stable operation is performed, and occurrence of inconvenience such as damage, etc. of package resulting from evaporation of moisture immersed into the inside in reflow soldering, etc. is also prevented so that manufacturing of high frequency module is performed. Further, in the manufacturing method for high frequency module, as the result of the fact that high frequency circuit portion in which various passive elements are formed on planarized (flattened) build-up formation surface of the base substrate portion including relatively inexpensive organic substrate is formed with high accuracy, reduction of the cost can be realized, and the base substrate portion is constituted as, e.g., wiring portions for power supply and/or ground portion, and/or wiring portion for the control system so that high frequency module in which electrical isolation from the high frequency circuit portion has been realized is manufactured. In accordance with the manufacturing method for high frequency module, since occurrence of electrical interference of the high frequency circuit portion is suppressed so that the characteristic has been improved, and wirings for the power supply and/or the ground portion having sufficient area can be formed on the base substrate portion, high frequency module in which power supply of high regulation is performed is manufactured.

Still further objects of the present invention and practical merits obtained by the present invention will become more apparent from the description of the embodiments which will be given below with reference to the attached drawings.

BEST MODE FOR CARRYING OUT THE INVENTION

Embodiments of the present invention will now be described in detail with reference to the attached drawings.

First, a high frequency module to which the present invention has been applied will be explained. The high frequency module is used in various electronic equipments having wireless communication function, e.g., personal computers, audio equipments, various mobile equipments and/or mobile telephones, etc. and constitutes analog front end of the wireless transmitting/receiving unit.

Figure 1:
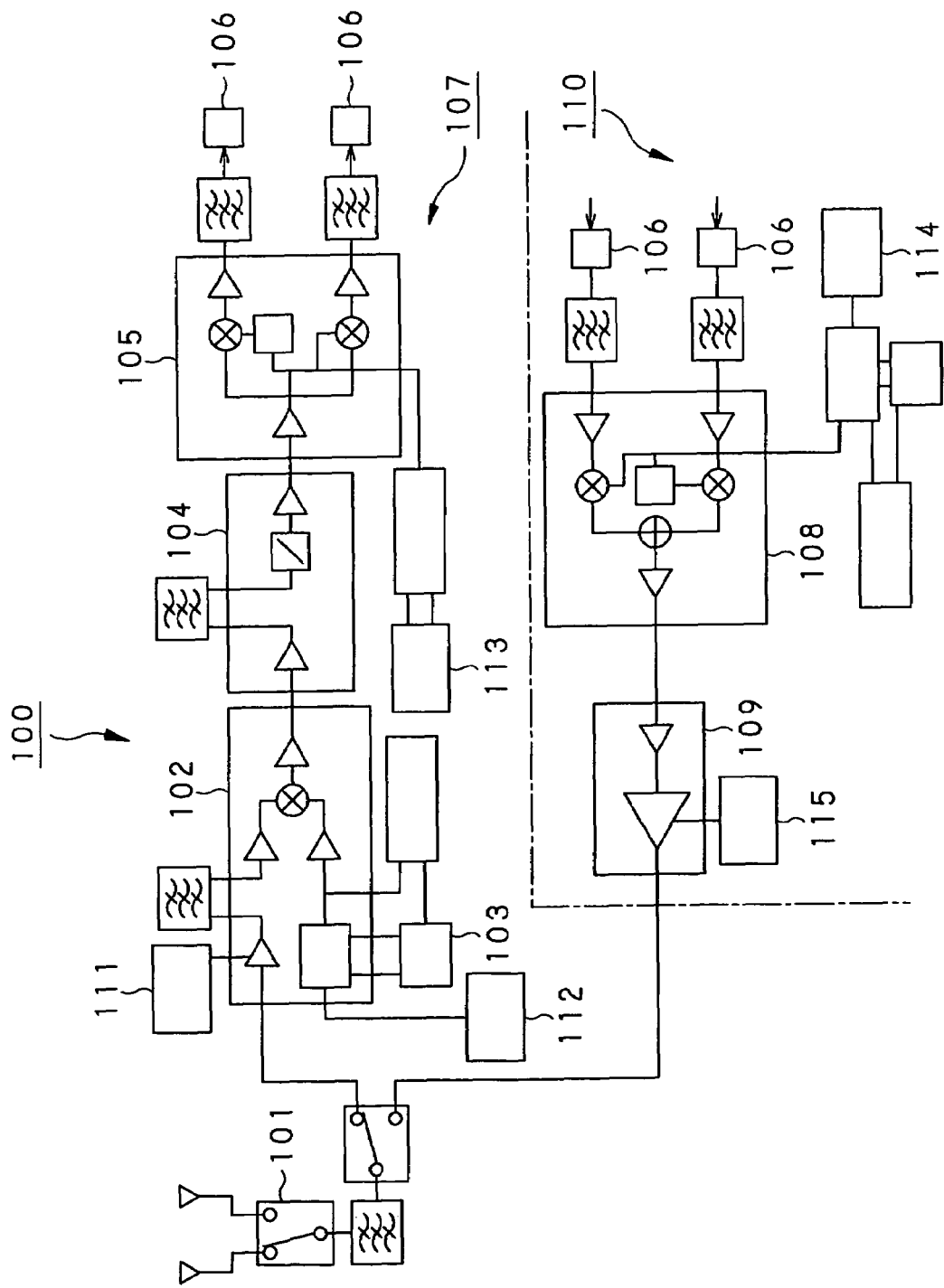
FIG. 1 is a block diagram showing a circuit configuration of a wireless communication module in which multi-band configuration has been realized.
Figure 2:
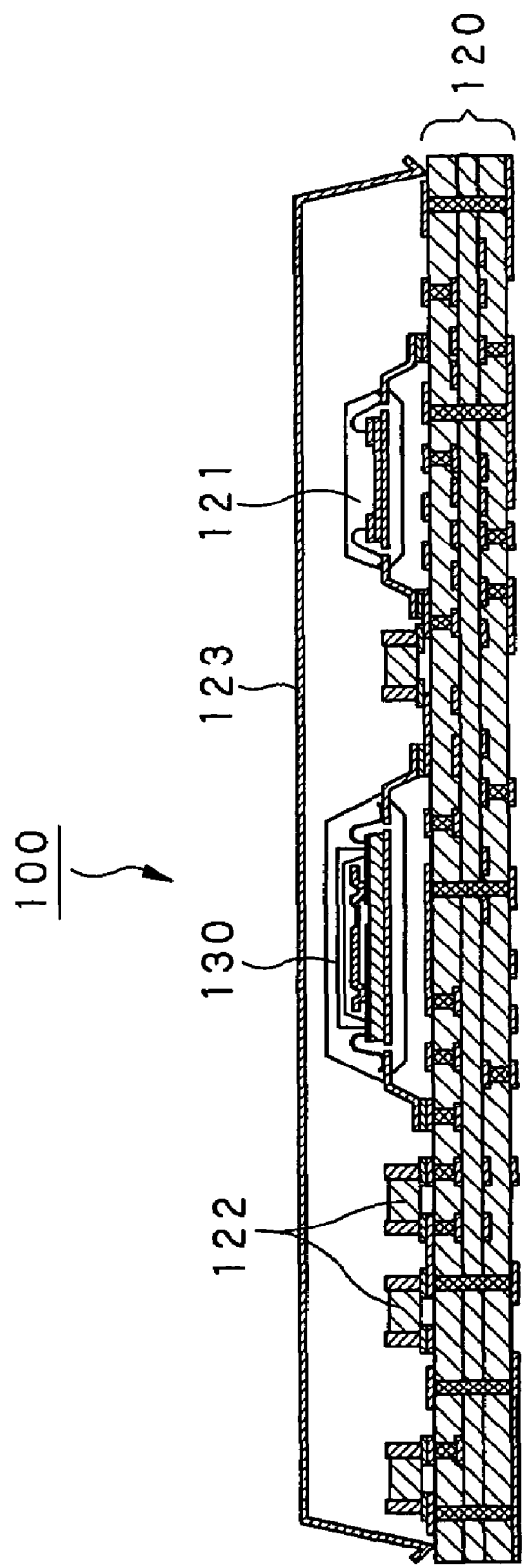
FIG. 2 is an essential part longitudinal cross sectional view showing a conventional wireless communication module.
Figure 3:
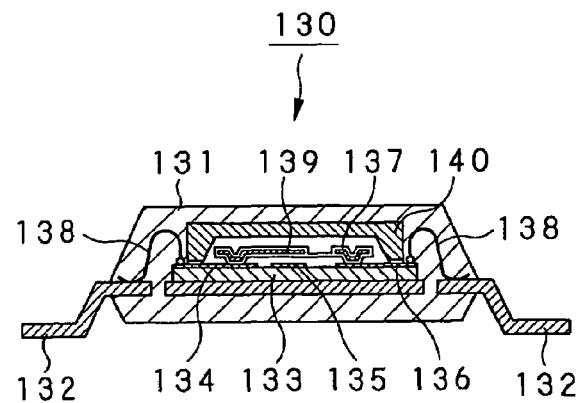
FIG. 3 is a longitudinal cross sectional view showing MEMS switch package used in the conventional wireless communication module.
Figure 4:
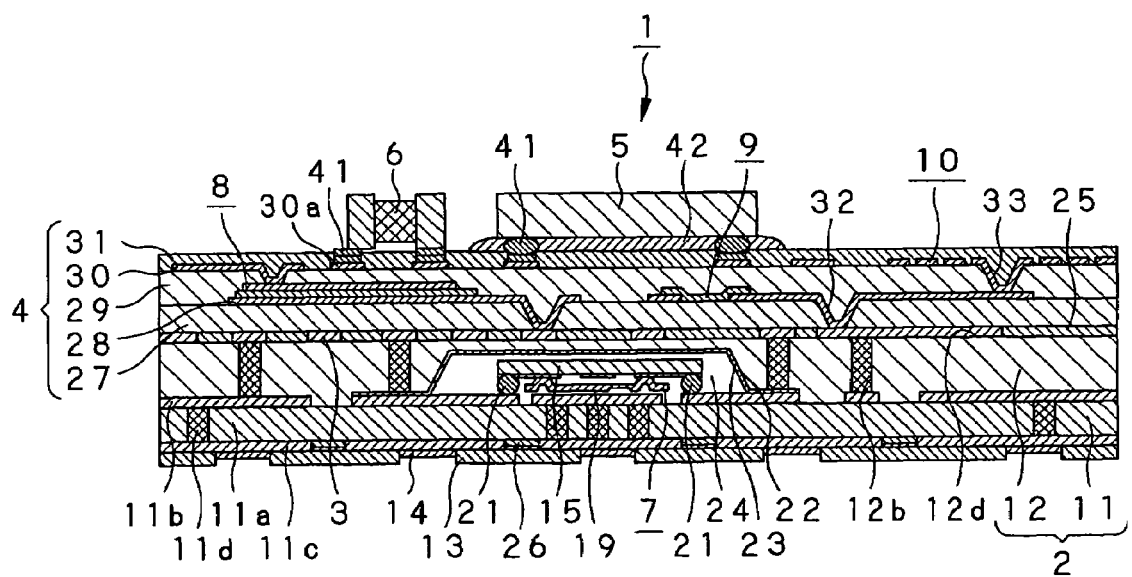
FIG. 4 is an essential part longitudinal sectional view showing a high frequency module according to the present invention.

As shown in FIG. 4, the high frequency module 1 according to the present invention is caused to be of the so-called multi-band configuration in which the base band portion is shared with respect to the same modulation/demodulation system or the different modulation/demodulation systems, and transmission/reception of wireless signals of different frequency bands can be made. Although the detail will be described later, the high frequency module 1 is composed of a base substrate portion 2 formed by base substrate portion manufacturing process, and a high frequency circuit portion 4 which is build-up formed by high frequency circuit portion manufacturing process on a build-up formation surface 3 constituted by planarizing (flattening) the first principal surface of the base substrate portion 2.

The high frequency module 1 comprises, although the detailed explanation is omitted, circuit units for receive signal processing system and transmit signal processing system, and has the function equivalent to the above-described conventional wireless communication module 100. In the high frequency module 1, the base substrate portion 2 constitutes the mounting surface with respect to wiring portions for the power supply system and or the control system with respect to the high frequency circuit portion 4, or interposer (not shown). In the high frequency module 1, high frequency ICs 5 and chip components (parts) 6 are mounted with the uppermost layer surface of the high frequency circuit portion 4 being as a mounting surface, and shield cover (not shown) is assembled so that the entirety of the surface is sealed.

At the high frequency module 1, MEMS switches 7 are mounted (assembled) in the state where they are sealed within the base substrate portion 2. By performing switching operation of the MEMS switches 7, capacity switching operations of variable capacitor and variable reactance of the receive signal processing system or the transmit signal processing system are performed to perform control of switching of time constant so as to match frequency characteristics of receive signal and/or transmit signal. In the high frequency module 1, at high frequency circuit portion formation process which will be described later, capacitor elements 8, resistor elements 9 and/or inductor elements 10 are formed as film along with wiring layers within the high frequency circuit portion 4.

Figure 5:
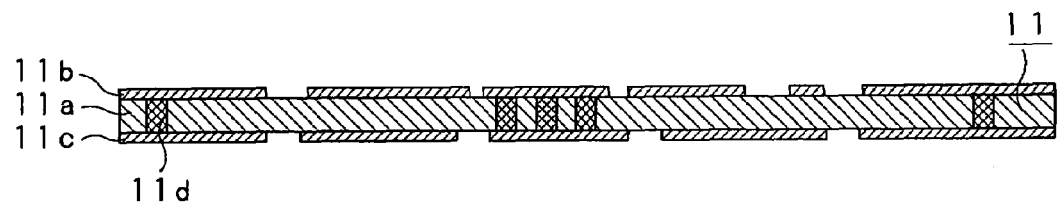
FIG. 5 is a longitudinal cross sectional view showing double-sided substrate used in the high frequency module according to the present invention.

The base substrate portion 2 is formed after experiencing a MEMS switch mounting step of mounting, with a double-sided substrate 11 serving as a first organic substrate being as a base substrate, MEMS switches 7 on the double-sided substrate 11, a connecting step of connecting an organic insulating block body 12 serving as a second organic substrate to the double-sided substrate 11, a wiring formation step of forming wiring patterns 12a or vias 12b at the organic insulating block body 12, and a planarization (flattening) step of planarizing (flattening) the surface of the organic insulating block body 12 to form build-up formation surface 3, etc. At the double-sided substrate 11, as shown in FIG. 5, wiring patterns 11b, 11c are formed on the face principal surface and the back principal surface of the organic substrate 11a, and these wiring patterns 11b, 11c are connected through through-holes 11d.

At the double-sided substrate 11, the organic substrate 11a is molded by thermoplastic synthetic resin having low dielectric constant and low Tan δ characteristic, i.e., satisfactory high frequency characteristic, and excellent in heat resistance characteristic, chemical resistance characteristic, moisture resistance characteristic and/or sealing resistance characteristic, e.g., polyolefine resin, liquid crystal polymer (LCP) or polyphenyl ethylene (PPE), etc. Wiring pattern formation method conventionally used, e.g., additive method, etc. is implemented to the double-sided substrate 11 so that wiring patterns 11b, 11c are formed and through-holes 11d are formed at the face principal surface and the back principal surface of the organic substrate 11a as shown in FIG. 5. Patterning by plating resist is performed onto the face principal surface and the back principal surface of the organic substrate 11a where penetration holes are formed in advance to form conductive patterns by electroless copper plating thereafter to remove plating resist. Thus, the double-sided substrate 11 is formed.

It is to be noted that the double-sided substrate 11 may be also formed by, e.g., semi-additive method, and may be also formed by subtractive method by using copper-clad substrate. With respect to the organic substrate 11a, as described later, moisture resistance processing and or sealing processing may be implemented so that there may be used not only the above-described substrate materials, but also base material consisting of phenol resin, bismaleimide triazine (BT-resin), polyimide, polytetrafluoroetyylene, polynorbornane (PNB), glass epoxy, ceramic or mixture of ceramic and organic material, etc.

At the double-sided substrate 11, the first wiring pattern 11b constitutes power supply circuit portion and or ground portion, etc., and the second wiring pattern 11c constitutes mounting portion onto the interposer, etc. At the double-sided substrate 11, as the detail will be described later, a protective layer 13 consisting of solder resist which covers or coats the second wiring pattern 11c is formed, and an input/output terminal electrode 14 is formed.

Figure 6:
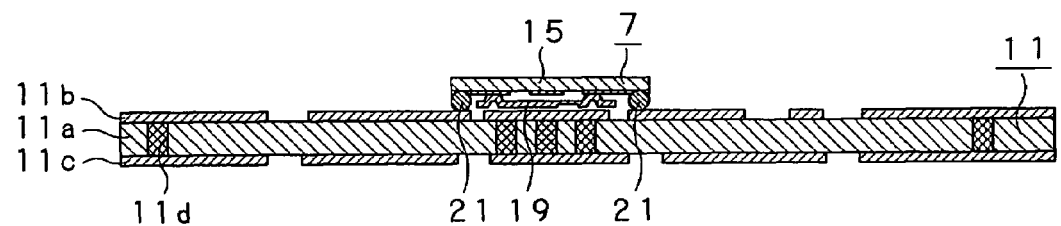
FIG. 6 is a longitudinal cross sectional view showing a step of mounting MEMS switch on the double-sided substrate.
Figure 7:
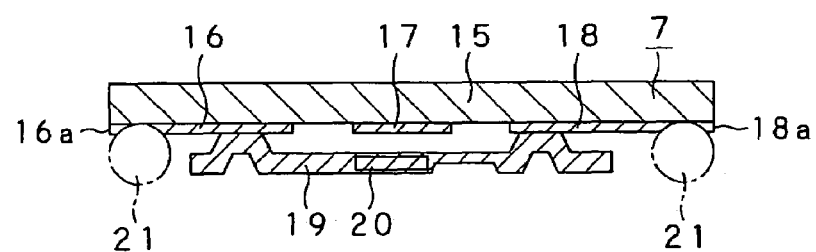
FIG. 7 is an essential part side view showing MEMS switch used in the high frequency module.

MEMS switch mounting process by, e.g., flip-chip method is implemented to the double-sided substrate 11. As shown in FIG. 6, MEMS switch 7 is mounted at a predetermined position of the first wiring pattern 11b. While the fundamental configuration of the MEMS switch 7 is caused to be the same as the above-described MEMS switch package 130, the MEMS switch 7 is used in the so-called bare state where insulating cover 131 and/or silicon cover 140 are not included (provided) as shown in FIG. 7. Accordingly, the MEMS switch 7 is caused to be of the configuration in which the entirety thereof is thin as compared to the MEMS switch package 130.

At the MEMS switch 7, as shown in FIG. 7, a first fixed contact 16, a second fixed contact 17 and a third fixed contact 18 are formed on a silicon substrate 15, and a movable contact piece 19 in a thin-plate form and having flexibility is cantilever-supported with respect to the first fixed contact 16. At the MEMS switch 7, connection pads 16a, 18a are respectively formed in a manner integral with the first fixed contact 16 and the third fixed contact 18 on the silicon substrate 15. At the MEMS switch 7, the free end of the movable contact piece 19 is opposed to the third fixed contact 18, and an electrode 20 is provided at the position opposite to the second fixed contact 17.

At the MEMS switch mounting process, as indicated by chain line in FIG. 7, gold ball bumps 21 are respectively formed on connection pads 16a, 18a of the first and third fixed contacts 16 and 18 of the MEMS switch 7. At the MEMS switch mounting process, although the detail is omitted, nickel-gold plating is implemented onto the connection pads formed at the first wiring pattern 11b of the double-sided substrate 11 to form electrodes. In this example, the electrode is formed so that the thickness of the nickel layer is 4μ to 5 μm, and the thickness of the gold layer is 0.3 μm or more.

At the MEMS switch mounting process, the MEMS switches 7 are mounted with respect to the double-sided substrate 11 after undergone positioning in the state where the silicon substrate 15 is caused to be at the upper side so that opposite spacing is maintained by the gold ball bumps 21. At the MEMS switch mounting process, e.g., ultrasonic wave is applied while applying pressure to the gold ball bumps 21 so that it has about several ten grams in the state where the double-sided substrate 11 is heated so that its temperature is about 80° C. to 120° C. to thereby mount MEMS switches 7 on the double-sided substrate 11. It is to be noted that the MEMS switch mounting process is not limited to such ultrasonic wave flip-chip mounting method, but MEMS switches 7 may be mounted on the double-sided substrate 11 by suitable bare chip mounting method.

At the double-sided substrate 11, there is implemented connecting process for connecting organic insulating block body 12 onto the principal surface where MEMS switches 7 are mounted. The organic insulating block body 12 is also molded by thermoplastic synthetic resin having low dielectric constant and low Tan δ characteristic, i.e., satisfactory high frequency characteristic, and excellent in heat resistance characteristic, chemicals resistance characteristic or moisture resistance characteristic, e.g., polyolefine resin, liquid ctystal polymer (LCP) or polyphenyl ethylene (PPE), etc. Moreover, as material of the organic insulating block body 12, there may be also used, e.g., phenol resin, bismaleimide triazine (BT-resin), polyimide, polytetrafloroethylene, polynorbornane (PNB), glass epoxy, ceramic or mixture of ceramic and organic material, etc. The organic insulating block body 12 is formed as a rectangular block body having outer appearance sufficient to cover the entire surface of the double-sided substrate 11 and thickness slightly larger than height of the MEMS switch 7.

Figure 8:
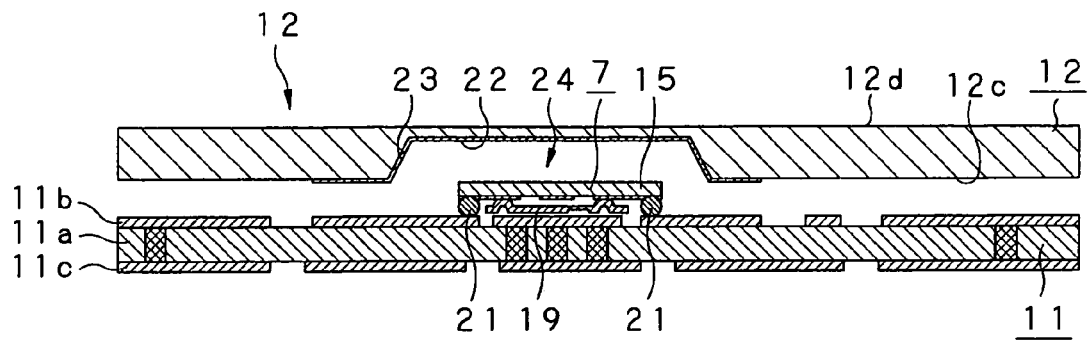
FIG. 8 is a longitudinal cross sectional view showing a step of connecting organic insulating block body to the double-sided substrate.

At the organic insulating block body 12, as shown in FIG. 8, a recessed portion 22 having opening shape sufficient to cover MEMS switch 7 is formed at the connecting portion to the double-sided substrate 11. As the result of the fact that metallic shield layer 23 is formed as film at the internal surface of the recessed portion, the recessed portion 22 is constituted so that moisture resistance characteristic and/or sealing characteristic are maintained in the state where the MEMS switch is covered as described later. The metallic shield layer 23 is formed as film by, e.g., the MID method (Molded Interconnect Device) of three-dimensionally forming electric circuits with respect to resin molded body by plating, etc. The metallic shield layer 23 may be formed as film by the deposition process.

At the connection process, the double-sided substrate 11 and the organic insulating block body 12 which have been described above are delivered to inactive gas atmosphere, e.g., nitric box, etc. to implement, e.g., ultrasonic wave welding method, etc. in the state where the organic insulating block body 12 is caused to overlap with the double-sided substrate 11 after undergone positioning as shown in FIG. 8 to integrate them. The double-sided substrate 11 and the organic insulating block body 12 seal MEMS switches 7 within the MEMS switch accommodating space portion 24 constituted by recessed portion 22 in the connected state.

At the connecting step, since the double-sided substrate 11 and the organic insulating block body 12 are connected within the nitric box as described above, nitric gas is sealed into the MEMS switch accommodating space portion 24. Accordingly, the MEMS switches 7 are mounted within the MEMS switch accommodating space portion 24 in the state where moisture resistance characteristic and oxidation resistance characteristic are maintained. From this fact, oxidation of respective components and/or sticking of movable contact piece 19, etc. are prevented. Thus, improvement in durability and operating stability can be realized. In addition, since the MEMS switches 7 are caused to undergo so-called bare mounting, miniaturization and thin structure of the high frequency module 1 can be realized, and the MEMS switches 7 are protected also with respect to mechanical load from the outside, etc.

Since the high frequency module 1 has excellent moisture resistance characteristic in such a manner that moisture is prevented from being immersed into the MEMS switch accommodating space portion 24, it is possible to prevent such an accident that moisture immersed at the time of reflow soldering process is evaporated as described later so that the MEMS switch accommodating portion is burst. At the high frequency module 1, since metallic shield layer 23 is formed at the internal surface of the recessed portion 22 so that the MEMS switch accommodating space portion 24 is constituted as electromagnetic shield space portion. As a result, influence of electromagnetic noise on the MEMS switches 7 is reduced. Thus, stable operation can be performed.

Figure 9:
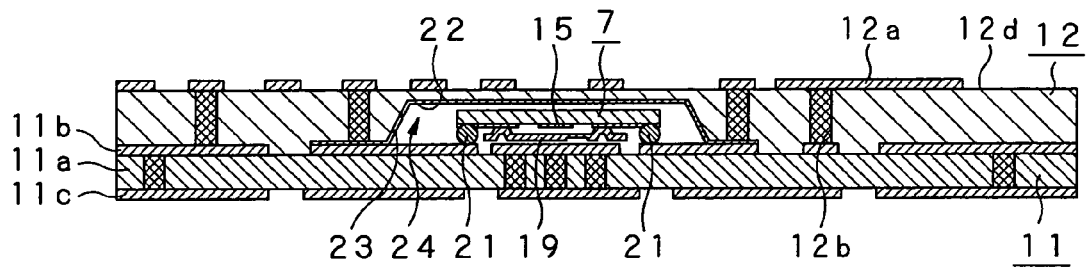
FIG. 9 is a longitudinal cross sectional view showing steps for wiring pattern and through-hole formed at organic insulating block body.

As shown in FIG. 9, wiring formation process is implemented to the organic insulating block body 12 so that predetermined wiring patterns 12a are formed on the principal surface 12d and vias 12b for realizing connection to the first wiring pattern 11b of the double-sided substrate 11 are formed. At the wiring formation step, via holes are formed at predetermined positions of the organic insulating body 12 with the first wiring pattern 11b being as a stopper by drill method, laser method or plasma method, etc. to implement desmear processing to the respective via holes. At the wiring formation step, wiring pattern formation method generally performed, e.g., additive method or semi-additive method, etc. is implemented to thereby form wiring patterns 12a on the principal surface 12d as shown in FIG. 9. In addition, at the wiring formation step, electrically conductive processing is implemented into the via holes along with wiring patterns 12a. Thereafter, cover formation is performed by the plating method. Thus, vias 12b are formed.

Figure 10:
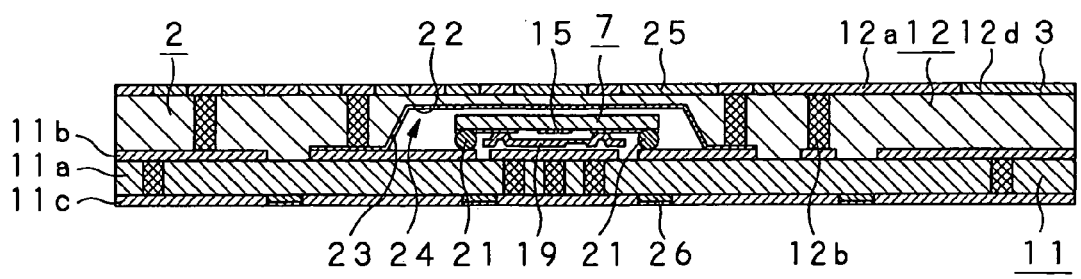
FIG. 10 is a longitudinal cross sectional view showing a step of planarizing (flattening) build-up formation surface of base substrate portion.

Planarization (flattening) process is implemented to the double-sided substrate 11 and the organic insulating block body 12 so that base substrate portion 2 having flat build-up formation surface 3 is formed as shown in FIG. 10. At the organic insulating block body 12, wiring patterns 12a are coated so that an insulating resin layer 25 having a predetermined thickness is formed, and polishing processing is implemented to the insulating resin layer 25. Also at the double-sided substrate 11, second wiring pattern 11c is coated so that an insulating layer 26 having a predetermined thickness is formed, and polishing processing is implemented to the insulating layer 26. For polishing processing, polishing material consisting of, e.g., mixed liquid of alumina and silica is used. The insulating resin layer 25 and the insulating resin layer 26 are polished until the wiring pattern 12a and the second wiring pattern 11c are exposed.

It should be noted that polishing processing may be performed in such a manner that the insulating resin layer 26 is left at a slight thickness without exposing the second wiring pattern 11c with respect to the double-sided substrate 11 side thus to protect the second wiring pattern 11c from chemicals or mechanical or themal load at high frequency circuit portion manufacturing step which will be described later. The insulating resin layer 26 is removed in forming input/output electrodes 14 on the double-sided substrate 11. With respect to the polishing processing, the insulating resin layer 25 and the insulating resin layer 26 are polished by dry etching method, e.g., Reactive Ion Etching (RIE) or Plasma Etching (PE), etc. so that they are planarized (flattened).

While the base substrate portion 2 is manufactured via the above-described respective process steps with the double-sided base 11 being as base, the manufacturing process is not limited to such process. A large number of base substrate portions 2 may be manufactured at the same time on the work of 8 cm or more, for example. The fundamental process for the base substrate portion 2 is caused to be the conventional manufacturing process for multi-layer wiring base so that the manufacturing process for multi-layer wiring board can be also applied. Thus, large scale plant and equipment investment becomes unnecessary. While the base substrate portion 2 is manufactured with relatively inexpensive double-sided base 11 being as base, such base substrate portion 2 may be also manufactured with a suitable base such as further inexpensive copper-clad base or substrate to which copper foil with resin is connected, etc. being as base.

High frequency circuit portion formation process is implemented to the base substrate portion 2 which has been manufactured via the above-described process steps so that high frequency circuit portion 4 is formed on the build-up formation surface 3 of the organic insulating block body 12. The high frequency circuit portion formation process includes a first dielectric insulating layer formation step, a first metallic thin film layer formation step, and a first wiring layer formation step. At the first wiring layer formation step, capacitor element 8 and resistor element 9 are formed as film as described later. The high frequency circuit portion formation step includes a second dielectric insulating layer formation step, a second metallic thin film layer formation step, a second wiring layer formation step, a resist layer formation step, and a parts (components) mounting step. At the second wiring layer formation step, an inductor element 10 is formed as film as described later.

As shown in FIG. 4, the high frequency circuit portion 4 is comprised of five layer structure of a first dielectric insulating layer 27, a first wiring layer 28, a second dielectric insulating layer 29, a second wiring layer 30, and a protective layer 31 for coating and protecting the second wiring layer 30. At the high frequency circuit portion formation step, in the case where the high frequency circuit portion 4 is caused to be of multi-layer configuration, a necessary number of dielectric insulating layer formation steps and wiring layer formation steps are repeated.

At the high frequency circuit portion 4, as shown in FIG. 4, the first wiring layer 28 is interlayer-connected to the first wiring pattern 11b of the base substrate portion 2 side through via 32 and via 12b. At the high frequency circuit portion 4, the first wiring layer 28 and second wiring layer 30 are interlayer-connected through via 33. At the high frequency circuit portion 4, capacitor element 8 and resistor element 9 are formed as film within the first wiring layer 28. At the high frequency circuit portion 4, inductor element 10 is formed as film within the second wiring layer 30. In this example, shield cover (not shown) is assembled onto the surface of the high frequency circuit portion 4 as occasion demands so that the influence of electromagnetic noise is excluded.

Figure 11:
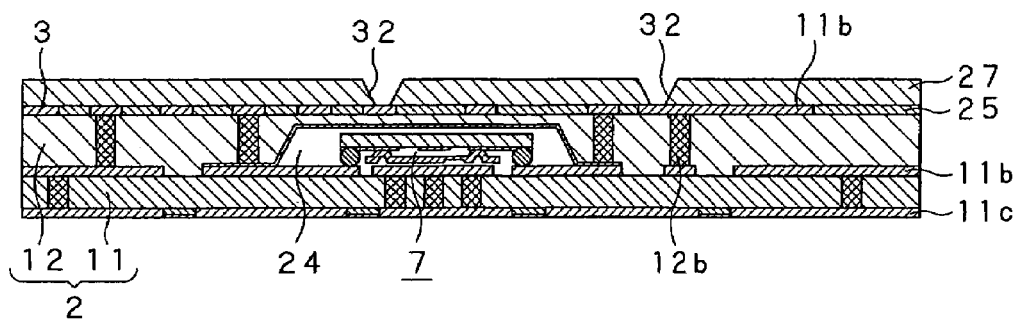
FIG. 11 is a longitudinal cross sectional view showing a step of forming first dielectric insulating layer of high frequency circuit portion.

Then, the manufacturing process for the high frequency circuit portion 4 will be explained in detail with reference to FIGS. 11 to 17. At the first dielectric insulating layer formation step, insulating dielectric material is coated onto the build-up formation surface 3 of the base substrate portion 2 to form, as film, first dielectric insulating layer 27 as shown in FIG. 11. As the insulating dielectric material, there is used, similarly to the base substrate 5, organic insulating base material excellent in the high frequency characteristic, and excellent in heat resistance characteristic, chemicals resistance characteristic and strong heat resistance characteristic of at least 160° C. or more. As the insulating dielectric material, there are used, e.g., benzocyclobutene (BCB), polyimide, polynorbornane (PNB), liquid crystal polymer (LCP), bismaleimide triazine. (BT-resin), polyphenyl ethylene (PPE), epoxy resin and/or acrylic resin. As the film formation method, spin-coat method, curtain-coat method, roll-coat method or dip-coat method in which coating uniformness and thickness controllability are maintained, etc. are applied.

At the first dielectric insulating layer 27, as shown in FIG. 11, there are formed a large number of via holes 32 communicating with electrode portions formed at the first wiring pattern 11b of the base substrate portion 2 side. In the case where photosensitive resin is used as insulating dielectric material, respective via holes 32 are formed by the photolithographic method with a mask formed into a predetermined patterning being attached to the first dielectric insulating layer 27. In the case where non-photosensitive resin is used as insulating dielectric material, respective via holes 32 are formed by implementing dry etching method, e.g., Reactive Chemical Etching, etc. to the first dielectric insulating layer 27 with, e.g., photo-resist or metallic film of gold, etc. being as mask.

Figure 12:
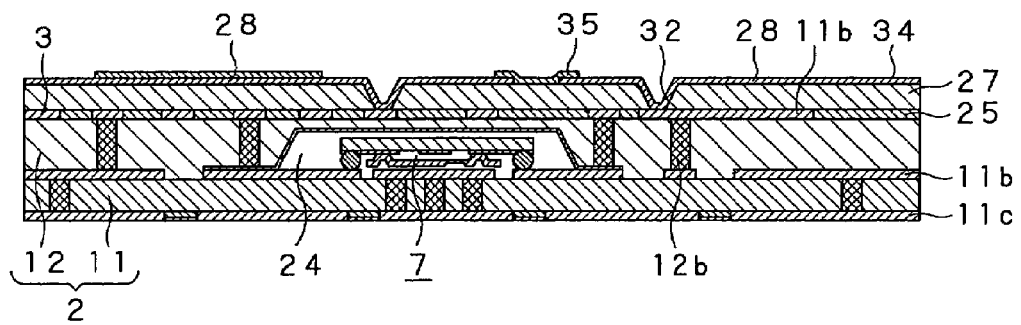
FIG. 12 is a longitudinal cross sectional view showing a step of forming first wiring layer of the high frequency circuit portion.

At the first metallic thin film formation step, as shown in FIG. 12, metallic thin film layer 34 of Cu, Al, Pt, Au, etc. is formed as thin film by,e.g., sputtering method, etc., on the first dielectric insulating layer 27. At the first metallic thin film formation process, in order to improve tightness between the first dielectric insulating layer 27 and the metallic thin film layer 34, e.g., metallic thin film of Cr, Ni, Ti, etc. may be formed as barrier layer. The metallic thin film layer 34 is composed of two layers of, e.g., Ti layer having thickness of 50 nm and Cu layer having thickness of 500 nm, and is formed as film over the entire surface of the principal surface of the first dielectric insulating layer 27.

The first wiring layer formation process includes a step of implementing etching to the portion where the resistor element 9 is formed with respect to metallic thin film layer 34, a step of forming TaN layer 35 over the entire surface thereof, a step of implementing anodic oxidation processing to the area where resistor element 9 is formed of the TaN layer 35 to form TaO layer 36, and a step of removing the TaN layer 35 and the metallic thin film layer 34 which are unnecessary to perform a predetermined patterning to form first wiring layer 28. At the first wiring layer formation process, etching processing for performing removal by using, e.g., etching liquid consisting of mixed acid of nitric acid, sulphoric acid, and acetic acid is implemented to metallic thin film layer 34 corresponding to the area where the resistor element 9 is formed. At the first wiring layer formation process, TaN layer 35 is formed as film as shown in FIG. 12 by, e.g., sputtering method, etc. in such a manner to coat the entire surface of the metallic thin film layer 34 including the area where the resistor element 9 is formed.

The TaN layer 35 acts as resistor within the area where the metallic thin film layer 34 has been removed to thereby constitute resistor element 9 within the first wiring layer 28. The TaN layer 35 acts as the base of tantalum oxide (TaO) dielectric film formed by anodic oxidation in forming, as film, capacitor element 8 as described later. The TaN later 35 is formed as film on the first dielectric insulating layer 27 or the metallic thin film layer 34 by, e.g., sputtering method so that its thickness is equal to about 20 μm. It is to be noted that Ta thin film may be used as the TaN layer 35.

At the first wiring layer formation process, there is implemented a processing which forms mask layer for anodic oxidation for allowing lower electrode of the area where the capacitor element 8 is formed to be faced toward the outside by opening portion and for coating (covering) other portions. At the anodic oxidation mask layer, e.g., photoresist in which patterning can be easily performed is used and it is only required that the coated portion can maintain sufficient insulating property with respect to applied voltage at the time of anodic oxidation processing of the subsequent step. Thus, the oxidation mask layer is formed so that its thickness is equal to several μm to several ten μm. It is to be noted that the anodic oxidation mask layer may be formed by patterning by using other insulating material by which thin film can be formed, e.g., silicon oxside material ($SiO_2$).

At the first wiring layer formation process, mask layer for anodic oxidation is formed as film thereafter to perform anodic oxidation processing to selectively perform anodic oxidation of the TaN layer 35 corresponding to the lower electrode of the capacitor element portion 8 exposed from the opening portion. At the anodic oxidation processing, e.g., ammonium borate is used as electrolytic solution, and voltage of 50v to 200v is applied. The applied voltage is suitably adjusted in order to form film thickness of TaO dielectric film formed in correspondence with opening portion of the anodic oxidation mask layer so as to have a desired thickness. At the first wiring layer formation process, the TaN layer 35 corresponding to the opening portion is selectively oxidized by the anodic oxidation processing to form TaO layer 36 serving as dielectric material of capacitor element 8 which will be described later.

Figure 13:
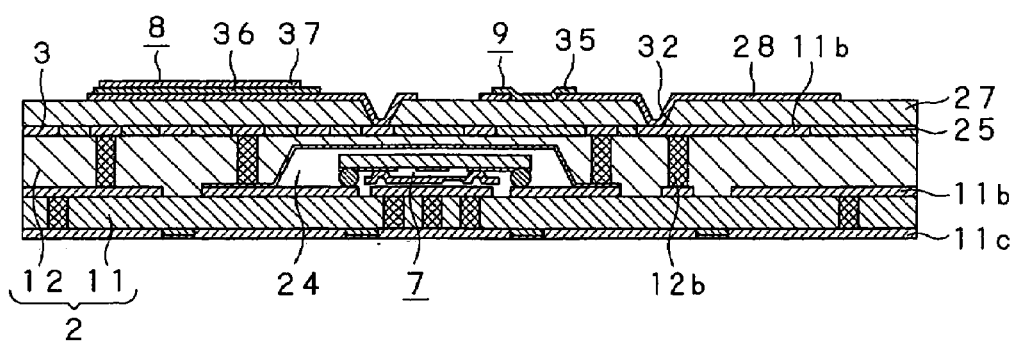
FIG. 13 is a longitudinal cross sectional view showing a step of forming capacitor elements and resistor elements at the first wiring layer.

At the first wiring layer formation process, photolithographic processing is implemented to the anodic oxidation mask layer functioning as photoresist layer, and the unnecessary portion of metallic thin film layer 34 is removed by etching processing so that predetermined first wiring layer 28 is formed as shown in FIG. 13. At the first wiring layer formation step, upper electrode 37 consisting of Ti—Cu film formed by sputtering method, etc. on the TaO layer 36 in the state where the anodic oxidation mask layer has been removed is formed as film, and capacitor element 8 is formed within the first wiring layer 28. It is to be noted that while the metallic thin film layer 34 is formed by Cu thin film having small line loss at the high frequency band as described above, such metallic thin film layer may be formed by metallic thin film of, e.g., Al, Pt or Au having tolerance with respect to the etching liquid.

While TaN layer 35 is caused to selectively undergo anodic oxidation in correspondence with the portions where the capacitor element 8 and the resistor element 9 are formed of the metallic thin film layer 34 through the anodic oxidation mask at the first wiring layer formation process, the first wiring layer formation process is not limited to such process. While photo-resist is used as anodic oxidation mask layer at the first wiring layer formation process, in the case where silicon oxide material is used, photo-resist is coated on to the anodic oxidation mask in performing patterning of the first wiring layer 28 so that photolithographic processing is implemented. In addition, at the first wiring layer formation step, anodic oxidation of TaN layer may be also performed over the entire surface thereafter to perform patterning of formed TaN+TaO layer. At the first wiring layer formation step, in the case where such processing is implemented, the surface of the TaN layer formed at the corresponding portion of the resistor element 9 is also caused to undergo anodic oxidation, whereby the oxidation film maintains the resistor element 9 as protective film for a long term.

Figure 14:
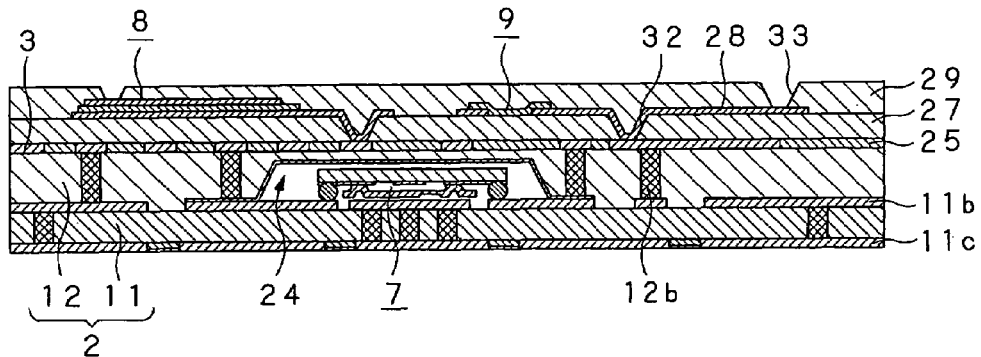
FIG. 14 is a longitudinal cross sectional view showing a step of forming second dielectric insulating layer of the high frequency circuit portion.

A second dielectric insulating layer formation step by insulating dielectric material similar to the same process as the formation process for the above-described first dielectric insulating layer 27 to the principal surface of the first wiring layer 28 so that second dielectric insulating layer 29 having uniform thickness is formed as film. At the second dielectric insulating layer formation step, a large of via holes 33 communicating with electrode portions formed at the first wiring layer 28 are formed as shown in FIG. 14. A second wiring layer formation step is implemented to the second dielectric insulating layer 29.

Figure 15:
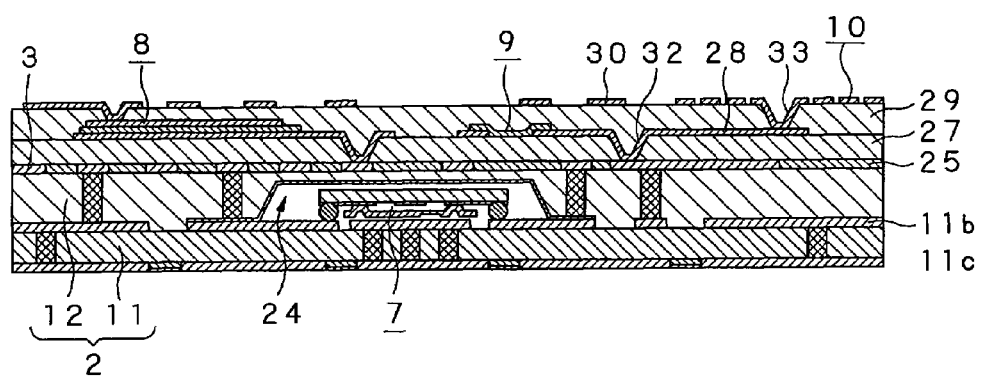
FIG. 15 is a longitudinal cross sectional view showing a step of forming second wiring layer and inductor element of the high frequency circuit portion.

The second wiring formation process consists of a step of forming, as film, metallic thin film layer, a patterning step for the metallic thin film layer, and a step of implementing electrolytic plating processing with respect to the metallic thin film pattern, etc. At the metallic thin film layer formation step, Ti—Cu layer is formed as film on the principal surface thereof by the sputtering method, etc. similarly to the formation step for metallic thin film layer 34 of the above-described first wiring layer formation process. At the patterning step, photo-resist is coated onto the entire surface of the metallic thin film layer thereafter to implement photolithographic processing to thereby form wiring pattern corresponding to the second wiring layer 30 as shown in FIG. 15.

At the electrolytic plating step, e.g., resist layer for plating having thickness of about 12 μm is formed as pattern onto the metallic thin film layer thereafter to perform electrolytic copper plating with the metallic thin film layer being as electrolyte take-out electrode. At the metallic thin film layer, copper plating layer of about 10 μm or more is lift-up formed at opening portion of the plating resist layer. At the electrolytic plating step, the plating resist layer is removed by rinse, and, e.g., wet etching processing is implemented to remove unnecessary metallic thin film layer to thereby form, as film, second wiring layer 30 consisting of predetermined pattern by the copper plating layer. At the second wiring layer formation step, inductor element 10 is formed as film at a portion of the second wiring layer 30 by the above-described electrolytic plating step. As the result of the fact that the inductor element 10 is formed as thick film by the electrolytic plating method, the inductor element is formed as film with a film thickness sufficient to have a predetermined characteristic.

Figure 16:
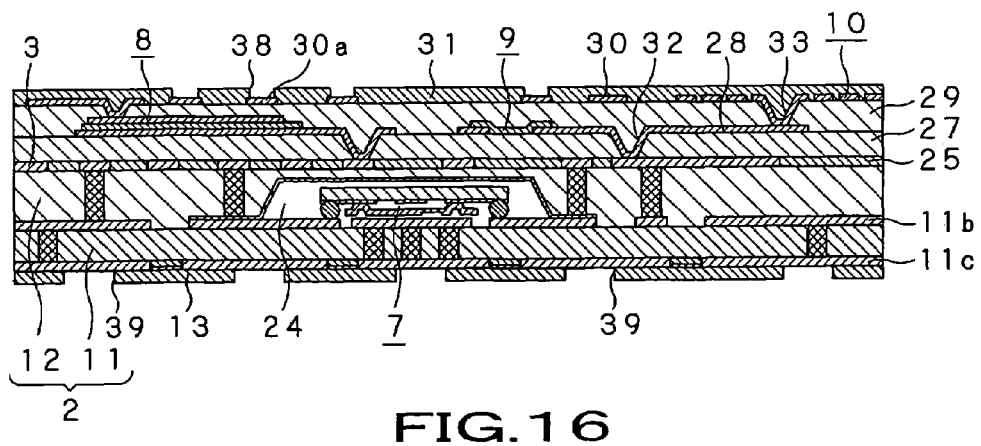
FIG. 16 is a longitudinal cross sectional view showing a step of forming protective layers at base substrate portion and the high frequency circuit portion.
Figure 17:
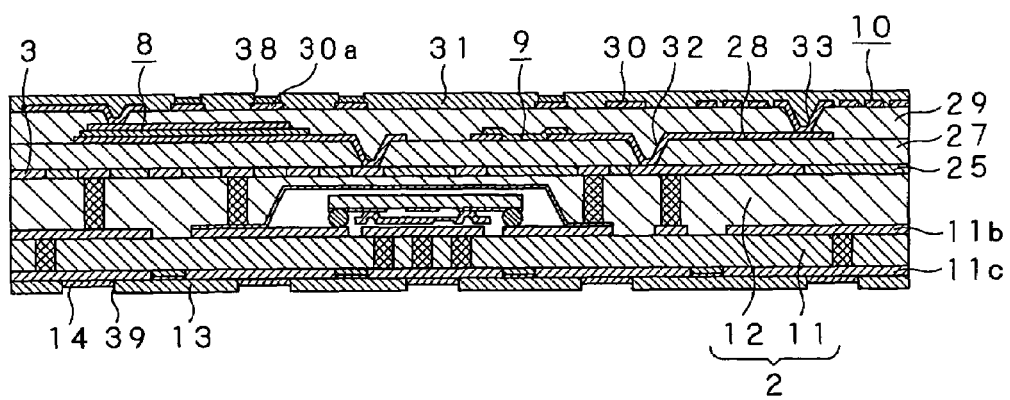
FIG. 17 is a longitudinal cross sectional view showing a step of forming electrodes at base substrate portion and high frequency circuit portion.

Protective layer formation process is implemented to the second wiring layer 30 so that protective layer 31 is formed as film on the principal surface thereof. The protective layer 31 is formed as the result of the fact that protective layer material, e.g., solder resist or interlayer insulating layer material, etc. is uniformly coated by the spin-coat method, etc. At the second wiring layer formation process, mask coating processing and photolithographic processing are implemented to the protective layer 31 so that a large number of opening portions 38 are formed in correspondence with electrodes 30a formed at the second wiring layer 30 as shown in FIG. 16. At the second wiring layer formation process, e.g., electroless Ni—Au plating processing or Ni—Cu plating processing, etc. is implemented to electrodes 30a exposed through the opening portions 38 to thereby form, as film, Ni—Au layer on the electrode 30a as shown in FIG. 17 to perform electrode formation.

On the other hand, second wiring pattern 11c formed at the bottom surface side of the double-sided substrate 1 is coated (covered) as described above as shown in FIG. 16 so that protective layer 13 is formed. Similarly to the protective layer 31 of the above-described high frequency circuit portion 4 side, solder resist, etc. is uniformly coated by the spin-coat method, etc. on the protective layer 13 so that the protective layer 13 thus coated is formed. It is to be noted that the protective layer 13 and the protective layer 31 may be also formed at the same time by, etc., dip method. Similarly to the formation process for opening portion 38, mask coating processing and photolithographic processing are implemented to the protective layer 13 so that a large number of opening portions 39 are formed in correspondence with electrodes formed on the second wiring pattern 11c as shown in FIG. 16. At the base substrata portion 2, electroless Ni—Au plating processing is implemented onto the electrodes of the second wiring pattern 11c through the opening portion 39 so that input/output terminal electrode 14 is formed.

At the high frequency circuit portion 4 laminated and formed on the base substrate portion 2 via the above-mentioned process steps, as shown in FIG. 4, high frequency ICs 5 and chip components (parts) 6 are mounted from electrodes 30a onto the protective layer 31 by suitable surface mounting method such as fili-chip method, etc. At the mounting step, gold bumps 41 are provided at respective connecting pads of which details are omitted of the high frequency ICs 5 and chip components (parts) 6, and the high frequency ICs 5 and the chip component (part) 6 are mounted, by the printing method, etc., in the state where they are caused to undergo positioning with respect to high frequency circuit portion 4 to which solder is delivered. At the mounting step, reflow soldering is implemented in the state so that high frequency ICs 5 and chip components 6 are electrically connected onto the high frequency circuit portion 4 and are mounted thereon. Thus, high frequency module 1 is manufactured. In this example, at the mounting step, rinsing step is implemented as occasion demands, and underfill resin 42 is filled between high frequency IC 5 and the protective layer 31 as shown in FIG. 4.

The high frequency module 1 which has been manufactured via the above-mentioned process steps is mounted, by suitable mounting method, at interposer (not shown), etc. through input/output terminal electrode 14 of the base substrate portion 2. The high frequency module 1 is mounted after undergone positioning on the interposer to which solder is delivered onto the connection electrodes in the state where, e.g., gold bumps are provided at the input/output terminal electrode 14, and is mounted thereon by implementing reflow soldering.

As the result of the fact that MEMS switches 7 which can change capacity characteristic of antenna and/or filter to realize multi-band function are sealed at the inside of the base substrate portion 2 within the nitric gas atmosphere in the state where moisture resistance characteristic and oxidation resistance are maintained as described above, improvements in the operating characteristic and durability of the MEMS switch 7 can be realized. At the high frequency module 1, as the result of the fact that MEMS switches 7 are provided at the inside of the base substrate portion 2, path lengths with respect to respective wiring layers are shortened. Thus, low loss and improvement in noise resistance characteristic can be realized. As the result of the fact that MEMS switches 7 which are not packaged are used, the high frequency module 1 can be miniaturized and is permitted to be of the thin structure.

At the high frequency module 1, there is formed, with high accuracy, high frequency circuit portion 4 in which passive elements 8 to 10 are formed as film on the planarized (flattened) build-up formation surface 3 of the base substrate portion 2 having relatively inexpensive double-sided substrate 11. Accordingly, at the high frequency module 1, improvement in the characteristic and reduction of cost can be realized, and the base substrate portion 2 is constituted as wiring portions for the power supply and/or the ground portion or wiring portions for the control system so that electrical isolation from the high frequency circuit portion 4 can be realized. At the high frequency module 1, occurrence of electrical interference of the high frequency circuit portion 4 is suppressed so that improvement in the characteristic can be realized. In addition, since wirings for power supply and/or ground portion having sufficient area can be formed on the base substrate portion 2, power supply of high regulation can be performed.

While, in the above-described high frequency module 1, MEMS switches 7 are flip-chip mounted with respect to the first wiring pattern 11b of the double-sided substrate 11, and are accommodated within MEMS switch accommodating space portion 24 constituted within the base substrate portion 2, the present invention is not limited to such configuration. At a high frequency module 45 shown in FIG. 18, MEMS switch 7 is accommodated within the MEMS switch accommodating space portion 24 in the state connected to the double-sided substrate 11 by the wire bonding method. It is to be noted that since the high frequency module 45 is common to the above-described high frequency module 1 in other configuration except for mounting method for MEMS switch 7, common reference numerals are respectively attached to common portions, and their detailed explanation will be omitted.

Figure 18:
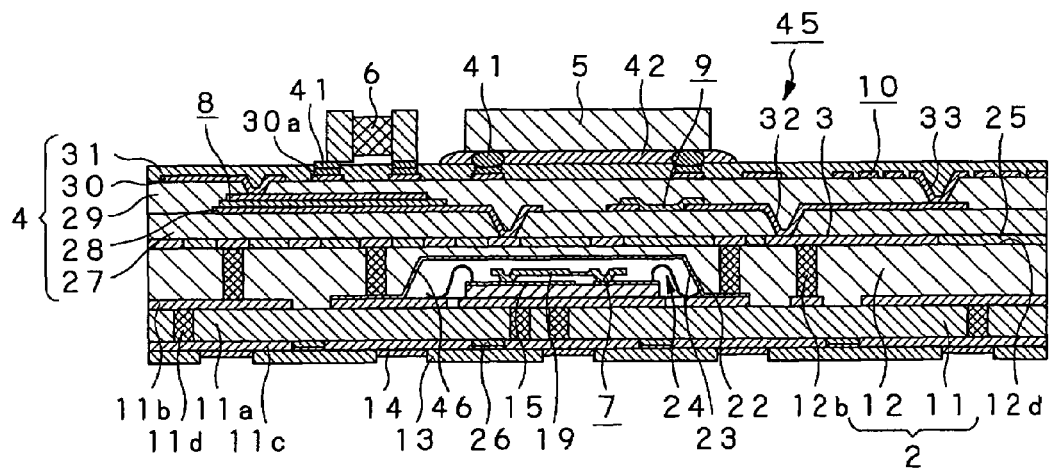
FIG. 18 is an essential part longitudinal cross sectional view of high frequency module in which MEMS switch is mounted by wire-bonding method.

At the MEMS switch 7, e.g., adhesive agent is coated onto the bottom surface of silicon substrate 15. Thus, as shown in FIG. 18, the MEMS switch 7 is connected thereto in the state mounted after undergone positioning within mounting area of the double-sided substrate 11. At the MEMS switch 7, wire bonding method is implemented to the portions between connection pads 16a, 18a for first and third contacts 16 and 18 and connection pads in which electrode formation has been implemented at the first wiring patterns 11b so that those connection pads are respectively connected by wires 46.

The high frequency module 45 is only required that the MEMS switch accommodating space portion 24 has length sufficient to hold the operating area of the movable contact piece 19 of the MEMS switch 7, thus to realize thin structure. In this example, at the double-sided substrate 11, connection pads of the first wiring pattern 11b are formed in a manner to surround the mounting area of the MEMS switch 7.

In a module board 50 shown in FIGS. 19 to 24, glass epoxy having slightly low moisture absorption characteristic or base material in which ceramic fillers are dispersed, which is used as base material of organic wiring board, may be used as material of a double-sided substrate 51. As described later, the module board 50 is characterized in the configuration in which a shield layer 52 is formed on at least one principal surface 51a of the double-sided substrate 51. Since the module board 50 is common to the above-described base substrate portion 2 in the fundamental configuration, common reference numerals are respectively attached to common portions and their detailed explanation will be omitted.

Figure 20:
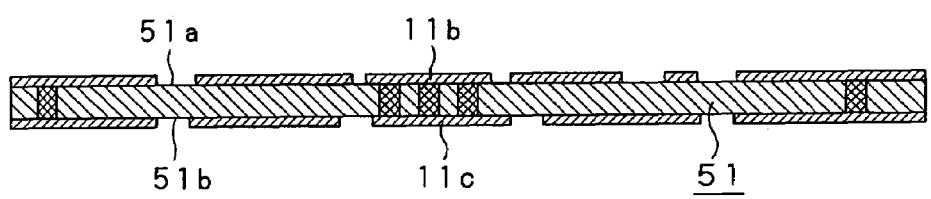
FIG. 20 is a longitudinal cross sectional view showing double-sided substrate used in the high frequency module.
Figure 21:
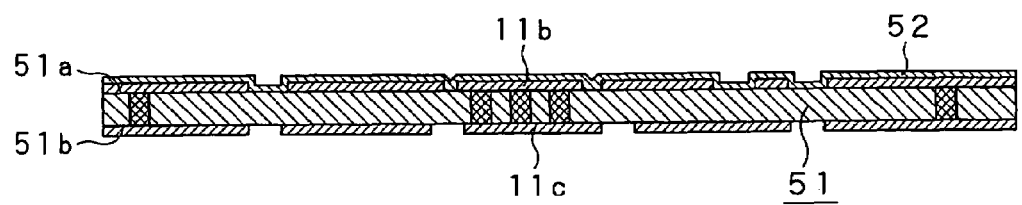
FIG. 21 is a longitudinal cross sectional view showing a step of forming shield layer at doubled-sided substrate.

At the double-sided substrate 51, as shown in FIG. 20, a first wiring pattern 11b and a second wiring pattern 11c are respectively formed on the face principal surface 51a and the back principal surface 51b. At the double-sided substrate 51, as shown in FIG. 21, shield layer 52 is formed on the first principal surface 51a on which MEMS switches 7 are mounted in such a manner to cover the entire surface thereof. The shield layer 52 consists of, e.g., silicon oxide ($SiO_2$) film, silicon nitride ($Si_3N_4$) film, silicon carbide (SiC) film, boron nitride (BN) film, or Diamond Like Carbon (DLC) film having moisture resistance characteristic and non-transmission characteristic of active or activated gas molecule such as oxygen, etc., i.e., oxidation resistance characteristic.

The shield layer 52 is formed as film by the above-described material, whereby the shield layer 52 can be formed as film under low temperature condition of about 100° C. such that out-gas is not produced from the double-sided substrate 51 at the time of film formation. The shiled layer 52 is formed as silicon oxide film or silicon carbide film by, e.g., sputtering method. The shield layer 52 is formed as silicon nitride film by Chemical Vapor Deposition (CVD) method under the light assist environment, or is formed as DLC film by the CVD method.

Figure 22:
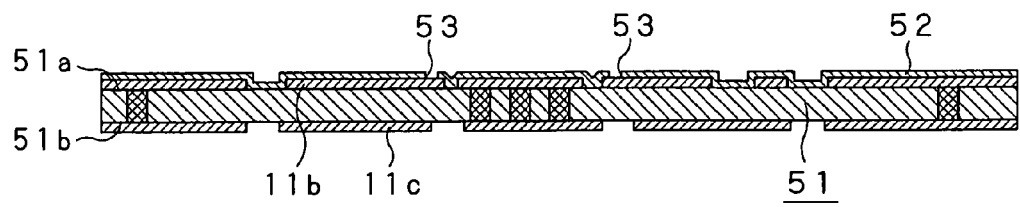
FIG. 22 is a longitudinal cross sectional view showing a step of forming an opening portion for connection at shield layer.

Photo-resist is coated onto the entire surface of the shield layer 52 thereafter to implement photolithographic processing, and opening portions 53 are formed at portions corresponding to connection pads of the first wiring pattern 11b as shown in FIG. 22. Nickel-gold plating is implemented to the connection pads through the opening portions 53 so that electrodes are formed.

Figure 23:
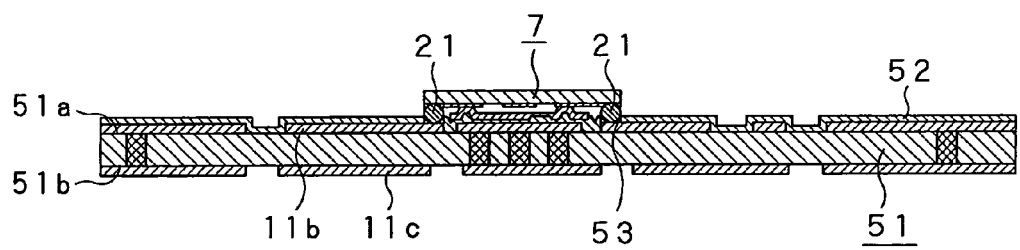
FIG. 23 is a longitudinal cross sectional view showing a step of mounting MEMS switch at the double-sided substrate.

At the double-sided substrate 51, as shown in FIG. 23, MEMS switch 7 is mounted on the first principal surface 51a. The mounting of the MEMS switches 7 is performed by, e.g., flip-chip method similarly to the above-described first embodiment. At the MEMS switch 7, gold ball bumps 21 are respectively formed on the first fixed contact 16 and the third fixed contact 18, and these gold ball bumps 21 are forced to connection pads of the first wiring pattern 11b through opening portions 53 to apply ultrasonic wave thereto in the heated state so that the MEMS switches 7 is mounted on the double-sided substrate 51 as shown in FIG. 23.

Figure 24:
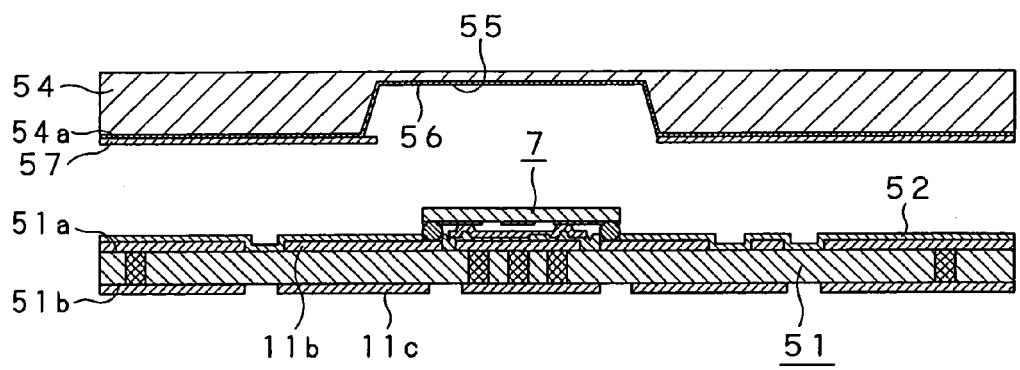
FIG. 24 is a longitudinal cross sectional view showing a step of connecting organic insulating block body to the double-sided substrate.

At the double-sided substrate 51, organic insulating block body 54 shown in FIG. 24 is connected onto the first principal surface 51a. Also as material of the organic insulating block body 54, there may be used glass epoxy having relatively low moisture absorption characteristic or base material in which ceramic fillers are dispersed, which is used as base material of general wiring board. Thus, the oraganic insulating block body 54 is also molded as rectangular block having outer appearance sufficient to cover (coat) the entire surface of the double-sided substrate 51 and thickness slightly larger than height of the MEMS switch 7. At the organic insulating block body 54, a recessed portion 55 having opening shape sufficient to cover the MEMS switch 7 is formed at the connecting surface 54a to the double-sided substrate 51. As described later, in the state where the organic insulating block body 54 is connected onto the double-sided substrate 51, the recessed portion 55 constitutes MEMS switch accommodating space portion which seals MEMS switch therewithin under the condition where moisture resistance characteristic and oxidation resistance characteristic are maintained.

At the organic insulating block body 54, shield layer 56 is formed as film on the entire surface of connecting surface 54a including recessed portion 55 similarly to the shield layer 52 of the above-described double-sided substrate 51 side. It is to be noted that since the shield layer 56 is formed also at the internal surface of the recessed portion 55, such shield layer 56 may be constituted by, e.g., metallic plating layer formed as film by the MID method. At the organic insulating block body 54, adhesive agent layer 57 is coated and formed at the connecting surface 54a except for the recessed portion 55. As the adhesive agent layer, there is used ultrasonic hardening type adhesive agent or thermo-hardening type adhesive agent which is generally used in the manufacturing process for multi-layer substrate. It is to be noted that in the case where the ultrasonic hardening type adhesive agent is used, the organic insulating block body 54 has ultraviolet ray transmission characteristic.

Figure 19:
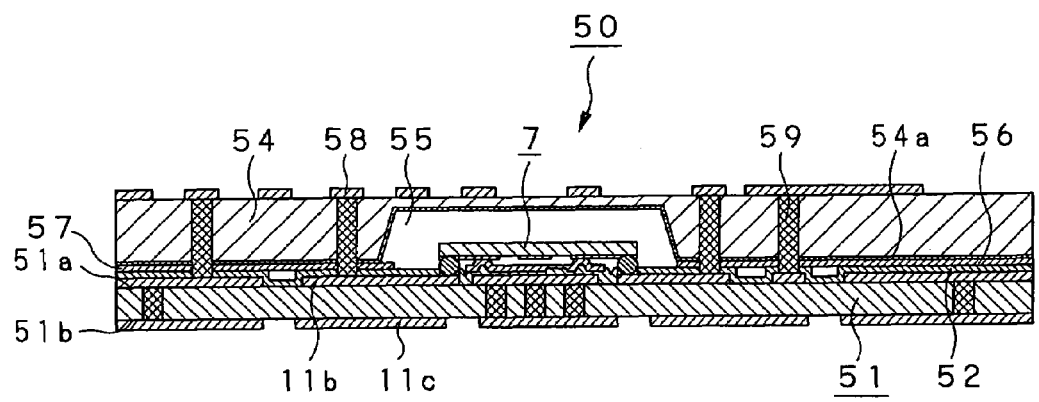
FIG. 19 is a longitudinal cross sectional view showing another example of high frequency module according to the present invention.

The double-sided substrate 51 and the organic insulating block body 54 which have been described above are connected in combination after they are caused to undergo positioning to each other in such a manner to accommodate MEMS switches 7 at the inside of the recessed portion 55 within nitric box to thereby manufacture module board 50 shown in FIG. 19. At the module board 50, the recessed portion 55 constitutes MEMS switch accommodating space portion in which moisture resistance characteristic and oxidation resistance characteristic are maintained by the shield layer 52 and the shield layer 56 to seal the MEMS switches 7. At the module board 50, since the double-sided substrate 51 and/or the organic insulating block body 54 are formed by relatively inexpensive material, reduction of cost can be realized.

At the module board 50, a suitable wiring pattern 58 is formed on the principal surface of the organic insulating block body 54. The wiring pattern 58 is interlayer-connected to the first wiring pattern 51a through via 59. Planarization (flattening) processing is implemented to the principal surface where the wiring pattern 58 is formed of the wiring pattern 58, and the above-described high frequency circuit portion 4 is laminated and formed to constitute high frequency module. It is to be noted that, at the module board 50, e.g., ultrasonic welding method, etc. may be implemented to the double-sided substrate 51 and the organic insulating block body 54 to thereby integrate them. At the module board 50, either one of the double-sided substrate 51 and the organic insulating block body 54 may be molded by material excellent in the heat resistance characteristic, the chemicals resistance characteristic or moisture resistance characteristic similarly to materials of the double-sided substrate 11 or the organic insulating block body 12 of the above-described base substrate portion 2 to thereby allow the shield layer to be unnecessary. Even in the case where the module board 50 is molded by such material, shield layer is formed so that further improvement in the reliability can be realized.

At the base substrate portion 2 and the module board 50 which have been described above, the step of mounting MEMS switch 7 and the step of connecting the double-sided substrates 11, 51 and the organic insulating block bodies 12, 54 are performed within the nitric gas atmosphere to thereby hermetically introduce or fill nitric gas into the inside of the MEMS switch accommodating space portions 24, 55.

Figure 25:
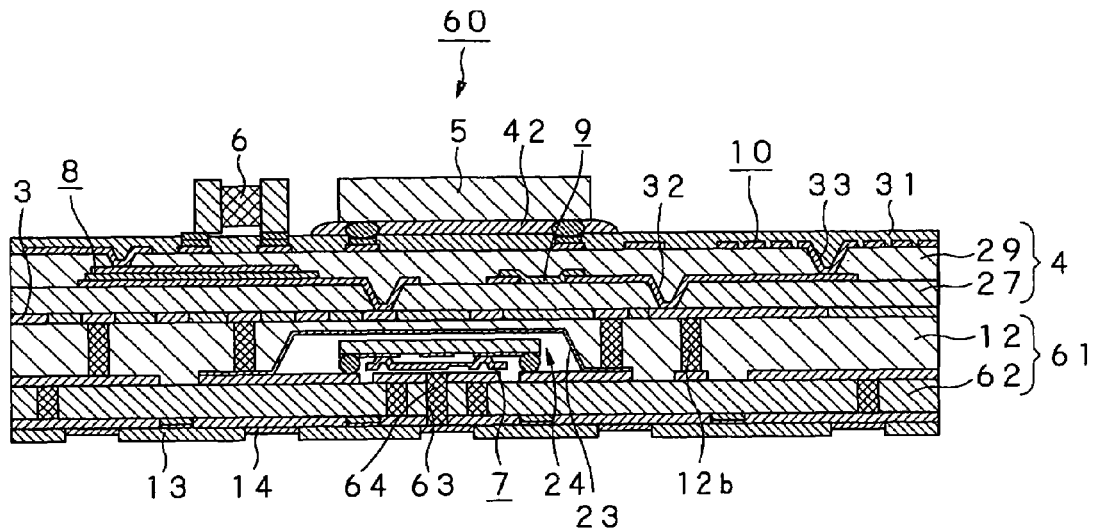
FIG. 25 is a longitudinal cross sectional view showing a further example of the high frequency module according to the present invention.
Figure 27:
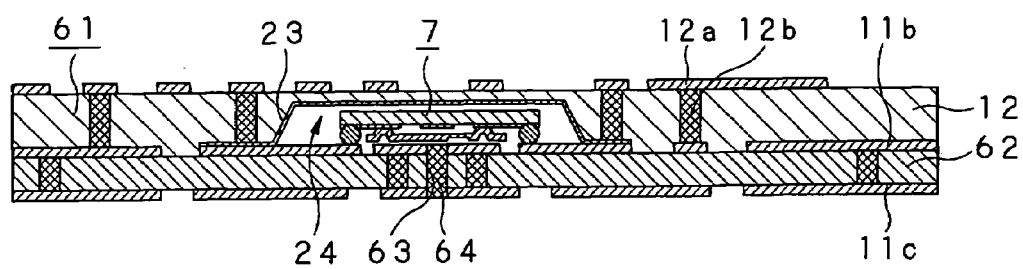
FIG. 27 is an essential part longitudinal cross sectional view showing the configuration of the base substrate portion, and shows the state where ventilation hole is closed.

Then, at a high frequency module 60 shown in FIGS. 25 and 27, a ventilation hole 63 is formed at the double-sided substrate 62 in which the organic insulating block body 12 is connected to constitute a base substrate portion 61. At the high frequency module 60, the step of mounting MEMS switch 7 and the step of connecting the double-sided substrate 62 and the organic insulating block body 12 are performed under the atmospheric environment. Since other configurations of the high frequency module 60 are equivalent to those of the above-described high frequency module 1, the same reference numerals are respectively attached to corresponding portions, and their explanation will be omitted.

Figure 26:
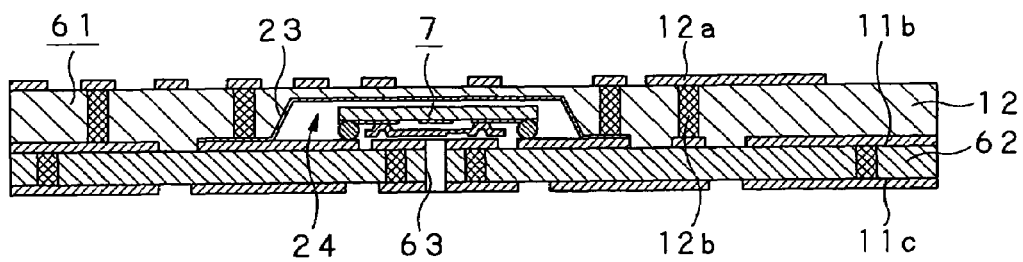
FIG. 26 is a longitudinal cross sectional view showing the configuration of base substrate portion, and shows the connecting state between double-sided substrate and organic insulating block body.

At the double-sided substrate 62, as shown in FIG. 26, MEMS switch 7 is mounted by the flip-chip method on the principal surface thereof. The step of mounting MEMS switch 7 is performed under the atmospheric environment. At the double-sided substrate 62, as shown in FIG. 26, ventilation hole 63 which penetrates the face principal surface and the back principal surface thereof is formed at the area where MEMS switch 7 is mounted. At the double-sided substrate 62, organic insulating block body 12 is connected onto the principal surface thereof via the step of mounting MEMS switch 7 to constitute base substrate portion 61. The step of connecting the organic insulating block body 12 is also performed under the atmospheric environment.

At the base substrate portion 61, the ventilation hole 63 communicates with the MEMS switch accommodating space portion 24 in this state, and the MEMS switch accommodating space portion 24 is placed in the atmospheric environment. At the base substrate portion 61, although not shown, the ventilation unit is connected to the ventilation hole, and air vent (deflating) operation within the MEMS switch accommodating space portion 24 is performed through the ventilation hole 63. At the base substrate portion 61, the inside of the MEMS switch accommodating space portion 24 is placed in substantially vacuum state by the ventilation unit. Thereafter, filling operation of nitric gas is performed.

At the base substrate portion 61, nitric gas is filled into the MEMS switch accommodating space portion 24 thereafter to fill filler 64 such as metal, glass excellent in air-tightness or resin, etc. into ventilation hole 63 from the bottom surface side of the double-sided substrate 62 to thereby close the ventilation hole 63 as shown in FIG. 27. At the base substrate portion 61, nitric gas is hermetically introduced or filled into the MEMS switch accommodating space portion 24 to thereby accommodate the MEMS switches 7 in the state where moisture resistance characteristic and oxidation resistance characteristic are maintained. In this example, polishing processing is implemented also to filler 64 along with insulating resin layer 26 formed by coating solder resist, etc. also with respect to the bottom surface side of the double-sided substrate 62 so that the entirety of the base substrate portion 61 is planarized (flattened).

At the base substrate portion 61 manufactured as described above, wiring pattern 12a is formed on the principal surface of the organic insulating block body 12, and insulating resin layer is formed as film and polishing processing is implemented thereto so that planarized (flattened) build-up formation surface 3 is formed. At the base substrate portion 61, high frequency circuit portion 4 is laminated and formed on the build-up formation surface 3. In addition, high frequency ICs 5 and chip components (parts) 6 are mounted on the high frequency circuit portion 4 to manufacture high frequency module 60.

It is to be noted that while ventilation hole 63 is formed at the double-sided substrate 62 in the high frequency module 60, ventilation hole may be formed at the organic insulating block body 12 side. Since the organic insulating block body 12 constitutes build-up formation surface of which principal surface has been planarized (flattened) and high frequency circuit portion 4 is laminated and formed thereon, polishing processing is implemented also to filler for closing ventilation holes, the organic insulating block 12 is planarized (flattened)

.

It is to be noted that while, in the above-described respective examples, MEMS switch accommodating space portion 24 is formed within the base substrate portion 2 to seal the MEMS switch in the state where moisture resistance characteristic and oxidation resistance characteristic are maintained, the present invention is not limited to such configuration (implementation). The high frequency module may be adapted so that element body, e.g., Surface Acoustic Wave element (SAW) having movable portion, etc. may be sealed along with MEMS switches 7 as element body within the MEMS switch accommodating space portion 24. It is a matter of course that the high frequency module may be adapted so that Surface Acoustic Wave element may be sealed at accommodating space portion formed similarly to the MEMS switch accommodating space portion 24 within the base substrate portion 2.

At the high frequency module according to the present invention, not only element body having movable portion, but also IC chips or LSI chips for micro wave or mili wave in which, e.g., resin coat is implemented so that the characteristic is considerably deteriorated may be sealed as element body at accommodating space portion formed within the base substrate portion 2. Such accommodating space portion is also formed in the state where moisture resistance characteristic is maintained similarly to the MEMS switch accommodating space portion 24 so that the element body is permitted to exhibit sufficient characteristic and protection can be made with respect to mechanical load from the external, etc. so that there is also no possibility that damage, etc. at the time of reflow soldering may take place.

It is to be noted that while the invention has been described in accordance with preferred embodiments thereof illustrated in the accompanying drawings and described in detail, it should be understood by those ordinarily skilled in the art that the invention is not limited to embodiments, but various modifications, alternative constructions or equivalents can be implemented without departing from the scope and spirit of the present invention as set forth by appended claims.

INDUSTRIAL APPLICABILITY

As described above, in accordance with the present invention, since element body is constituted at the inside of the wiring layer, and element body is directly formed within element body accommodating space where the moisture resistance characteristic and oxidation resistance characteristic are maintained, package for maintaining moisture resistance characteristic and/or oxidation resistance characteristic, and/or for protecting the element body or bodies from mechanical load from the external is not required at the element body. As a result, miniaturization thereof can be realized and path length with respect to the wiring layer is shortened. Thus, board device for module in which low loss and improvement in noise resistance characteristic have been realized can be obtained. Moreover, in accordance with the present invention, aging deterioration of the element body is maintained in a manner equivalent to the packaged state so that stable operation is performed, and occurrence of inconvenience such as damage, etc. by evaporation of moisture immersed into the inside of the element body accommodating space portion is prevented in implementing reflow soldering, etc. Thus, high accuracy module board device can be efficiently obtained.

Further, in accordance with the present invention, since the MEMS switch which can change capacity characteristic of antenna and/or filter to realize multi-band function, and/or element body of which characteristic is deteriorated by resin coating, etc. are constituted within the wiring layer of the base substrate portion, and are directly formed at the element body accommodating space portion in which moisture resistance characteristic and/or oxidation resistance characteristic are maintained, package for maintaining moisture resistance characteristic and/or oxidation resistance characteristic, and/or protecting the element body or bodies from mechanical load from the external is not required at the element body. As a result, miniaturization thereof can be realized and path length with respect to wiring length is shortened. Thus, high frequency module in which low loss and improvement in noise resistance characteristic have been improved can be obtained. Furthermore, in accordance with the present invention, aging deterioration of element body is maintained in a manner equivalent to the packaged state so that stable operation is performed, and occurrence of inconvenience such as damage, etc. of package by evaporation of moisture immersed into the inside is also prevented in reflow soldering, etc. Thus, high accuracy high frequency module can be efficiently obtained. Still furthermore, in accordance with the present invention, high frequency circuit portion in which various passive elements are formed on the planarized (flattened) build-up formation surface of the base substrate portion including relatively inexpensive organic substrate is formed with high accuracy. As a result, reduction of the cost can be realized, and the base substrate portion is constituted as, e.g., wiring portions for power supply and/or ground portion, and/or, wiring portion for the control system so that high frequency module in which electric isolation from the high frequency portion has been realized can be obtained. In accordance with the present invention, occurrence of electric interference of the high frequency circuit portion is suppressed so that improvement in the characteristic can be realized, and wirings for power supply and/or ground portion having sufficient area can be formed at the base substrate portion. From this fact, high frequency module in which power supply of high regulation is performed can be obtained.

The invention claimed is:

1. A module board device comprising:
    a first organic substrate in which a conductive pattern or patterns is or are formed on the principal surface thereof, and one element body or more is or are mounted; and
    a second organic substrate in which a recessed portion is formed in correspondence with the area where the element body or bodies is or are formed at a connecting surface to the first organic substrate,
    whereby, in the state where the second organic substrate is connected to the first organic substrate, an element body accommodating space portion which seals the element body or bodies is constituted by the recessed portion, and the element body accommodating space portion is constituted in such a manner that moisture resistance characteristic and oxidation resistance characteristic are maintained,
    and wherein a shield layer having moisture resistance characteristic and oxidation resistance characteristic is formed at the element mounting area of the first organic substrate and the recessed portion of the second organic substrate which constitute the element body accommodating space portion, the shield layer being formed in a recess of a layer having contacts formed therein.

2. The module board device as set forth in claim 1, wherein the first organic substrate and the second organic substrate are formed by organic material having moisture resistance characteristic, or mixed material including such organic material.

3. The module board device as set forth in claim 1, wherein the shield layer consists of silicon oxide layer, silicon nitride layer, silicon carbide layer, boron nitride layer, or Diamond Like Carbon layer of at least one layer or more which can be formed as film under the low temperature condition.

4. The module board device as set forth in claim 1, wherein the shield layer consists of at least one metallic layer or more, and serves to render electromagnetic wave resistance characteristic along with the moisture resistance characteristic and the oxidation resistance characteristic to the element body accommodating space portion.

5. The module board device as set forth in claim 1, wherein an air vent hole communicating with the element body accommodating space portion is formed at the first organic substrate or the second organic substrate, and the air vent hole is sealed after air is deflated from the element body accommodating space portion to fill inactive gas.

6. The module board device as set forth in claim 1, wherein the element body is Mechanical Electrical Micro System element, Surface Acoustic Wave filter element, high frequency element, or integrated circuit element having movable portion.

7. The module board device as set forth in claim 1, wherein the build-up wiring layer is constituted as a high frequency circuit portion in which at least one kind of element or elements is or are formed as film by the thin film technology or the thick film technology.

8. A high frequency module composed of:
    a base substrate portion comprising a first organic substrate in which a conductive pattern or patterns is or are formed on the principal surface thereof and an element body or bodies is or are mounted, and a second organic substrate in which a recessed portion is formed in correspondence with the area where the element body or bodies is or are mounted at a connecting surface to the first organic substrate, whereby, in the state where the second organic substrate is connected to the first organic substrate, an element body accommodating space portion which seals the element body or bodies is constituted by the recessed portion, the element body accommodating space portion is constituted in such a manner that moisture resistance characteristic and oxidation resistance characteristic are maintained, and a polishing processing is implemented onto an insulating resin layer provided on at least one second principal surface of the first organic substrate and the second organic substrate of the side opposite to a surface where the first organic substrate and the second organic substrate are connected to each other so that a planarized (flattened) build-up formation surface is formed; and a high frequency circuit portion provided on the build-up formation surface of the base substrate portion, wherein the high frequency circuit portion is constituted as a high frequency circuit portion comprising one build-up wiring layer or more including a conductive pattern or patterns formed on a dielectric insulating layer formed on the build-up formation surface, and at least one kind of passive element or more formed by the thin film technology or the thick film technology, the build-up wiring layer being via-connected to the base substrate portion and/or the element body or bodies, and high frequency circuit components (parts) mounted on the build-up wiring layer of the uppermost layer; and wherein the recessed portion of the second organic substrate is formed in a layer having contacts formed therein.

9. The high frequency module as set forth in claim 8, wherein the element body mounted on the base substrate portion is one Mechanical Electrical Micro System switch or more, and is operative so that switching operation is performed to thereby switch capacity characteristic of capacity pattern formed at the build-up wiring layer of the high frequency circuit portion.

10. A high frequency module according to claim 8, wherein a shield layer having moisture resistance characteristic and oxidation resistance characteristic is formed at the element mounting area of the first organic substrate and the recessed portion of the second organic substrate which constitute the element body accommodating space portion, the shield layer being formed in a recess of a layer having contacts formed therein.

* * * * *